(12) United States Patent
Ohkawa

(10) Patent No.: US 12,495,608 B2
(45) Date of Patent: Dec. 9, 2025

(54) SEMICONDUCTOR DEVICE AND METHOD OF MANUFACTURING SEMICONDUCTOR DEVICE

(71) Applicant: United Semiconductor Japan Co., Ltd., Kuwana (JP)

(72) Inventor: Narumi Ohkawa, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 493 days.

(21) Appl. No.: 17/989,676

(22) Filed: Nov. 17, 2022

(65) Prior Publication Data

US 2023/0187445 A1 Jun. 15, 2023

(30) Foreign Application Priority Data

Dec. 14, 2021 (JP) ................................. 2021-202722

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .. H10D 30/6735; H10D 30/024; H10D 30/62; H10D 30/63; H10D 30/67046;
(Continued)

(56) References Cited

U.S. PATENT DOCUMENTS 5,055,898 A 10/1991 Beilstein
5,393,681 A 2/1995 Witek
(Continued)

FOREIGN PATENT DOCUMENTS

JP 5-129551 A 5/1993
JP 6-85262 A 3/1994
(Continued)

OTHER PUBLICATIONS

European search report issued on May 12, 2023 for the EP application No. 22211090.0, filing date Dec. 2, 2022, pp. 1-5, May 12, 2023.

(Continued)

*Primary Examiner* — Julio J Maldonado
*Assistant Examiner* — Nathan Pridemore
(74) *Attorney, Agent, or Firm* — Winston Hsu

(57) ABSTRACT

A semiconductor device having a transistor with fin structure includes a channel layer that is disposed over a substrate and is connected to the substrate via a semiconductor layer, a source layer that is disposed on a first side surface of the channel layer over the substrate and is separated from the substrate via a first insulating layer, a drain layer that is disposed on a second side surface of the channel layer opposite to the first side surface over the substrate and is separated from the substrate via a second insulating layer, and a gate electrode including a first portion disposed over the channel layer and a second portion which is disposed between the substrate and the channel layer and whose third side surface or fourth side surface faces the semiconductor layer.

20 Claims, 43 Drawing Sheets

(51) Int. Cl.
  *H10D 30/43*  (2025.01)
  *H10D 30/67*  (2025.01)
  *H10D 62/10*  (2025.01)
  *H10D 62/13*  (2025.01)
  *H10D 64/01*  (2025.01)
  *H10D 84/01*  (2025.01)
  *H10D 84/03*  (2025.01)
  *H10D 88/00*  (2025.01)

(52) U.S. Cl.
  CPC ....... *H10D 30/6735* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/038* (2025.01); *H10D 88/01* (2025.01)

(58) Field of Classification Search
  CPC ........... H10D 30/6757; H10D 30/6734; H10D 30/014; H10D 30/43; H10D 30/6711; H10D 30/6219; H10D 30/235; H10D 84/128; H10D 84/158; H10D 84/016; H10D 84/834; H10D 84/837; H10D 84/856; H10D 84/0167; H10D 84/017; H10D 84/038; H10D 64/512; H10D 64/017; H10D 62/122; H10D 62/121; H10D 62/151; H10D 62/116; H10D 62/364; H10D 62/124
  See application file for complete search history.

(56) References Cited

U.S. PATENT DOCUMENTS

| | | |
|---|---|---|
| 2002/0011612 A1 | 1/2002 | Hieda |
| 2002/0036290 A1 | 3/2002 | Inaba |
| 2002/0053706 A1 | 5/2002 | Jung |
| 2004/0195610 A1 | 10/2004 | Morikado |
| 2006/0049429 A1 | 3/2006 | Kim |
| 2006/0244106 A1 | 11/2006 | Morikado |
| 2007/0023756 A1 | 2/2007 | Anderson |
| 2007/0145431 A1 | 6/2007 | Kim |
| 2008/0001187 A1 | 1/2008 | Booth |
| 2008/0020537 A1 | 1/2008 | Kim |
| 2008/0042219 A1 | 2/2008 | Booth |
| 2008/0142891 A1 | 6/2008 | Booth |
| 2008/0233699 A1 | 9/2008 | Booth |
| 2011/0073842 A1 | 3/2011 | Liu |
| 2014/0151746 A1 | 6/2014 | Loubet |
| 2014/0203327 A1* | 7/2014 | Pillarisetty ........... H10D 62/122 438/285 |
| 2018/0261668 A1 | 9/2018 | Yang |
| 2020/0135921 A1* | 4/2020 | Chiang .................. H10D 88/01 |
| 2020/0135929 A1 | 4/2020 | Van Dal |
| 2020/0279916 A1 | 9/2020 | Rachmady |
| 2021/0091181 A1 | 3/2021 | Keech |

FOREIGN PATENT DOCUMENTS

| | | |
|---|---|---|
| JP | 2002-110963 A | 4/2002 |
| JP | 2002-118255 | 4/2002 |
| JP | 2002-185012 A | 6/2002 |
| JP | 2003-152186 A | 5/2003 |
| JP | 2004-281782 A | 10/2004 |
| JP | 2007-173784 A | 7/2007 |
| JP | 2008-10876 A | 1/2008 |
| JP | 2009-16525 A | 1/2009 |
| JP | 2009-21503 | 1/2009 |
| JP | 2009-158710 A | 7/2009 |
| JP | WO2009/151001 A1 | 12/2009 |
| JP | 2010-50171 | 3/2010 |
| JP | 2012-209339 A | 10/2012 |
| JP | 2012-212913 A | 11/2012 |
| JP | 2012-256903 | 12/2012 |
| JP | 2014-110430 A | 6/2014 |
| JP | 2014-160774 A | 9/2014 |
| JP | 2021-52173 A | 4/2021 |

OTHER PUBLICATIONS

Notice of Allowance mailed/issued on Nov. 16, 2023 for EP application No. 22211090.0, filing date: Dec. 2, 2022, pp. 1-115, Nov. 16, 2023.

* cited by examiner

SEMICONDUCTOR DEVICE AND METHOD OF MANUFACTURING SEMICONDUCTOR DEVICE

CROSS REFERENCE TO RELATED APPLICATION

This application is based upon and claims the benefit of priority of the prior Japanese Patent Application No. 2021-202722, filed on Dec. 14, 2021, the entire contents of which are incorporated herein by reference.

BACKGROUND OF THE INVENTION

1. Field of the Invention

The embodiments discussed herein relate to a semiconductor device and a method of manufacturing the semiconductor device.

2. Description of the Prior Art

There is known a semiconductor device that has a transistor with fin structure (transistor structure sticking up like a fin) on a silicon-on-insulator (SOI) substrate. In addition, there has been proposed a fin-type transistor with a gate all around (GAA) structure, in which the channel of a transistor is completely surrounded by a gate (for example, see Japanese Laid-open Patent Publications No. 2021-52173 and 2007-173784, and International Publication Pamphlet No. 2009/151001).

By the way, the channel of a fin-type transistor formed on an SOI substrate is electrically isolated from a semiconductor substrate. Therefore, electric charge that is dependent upon the most recent history of operation is accumulated in the channel, and characteristic variations such as threshold voltage variation are likely to occur. Such a phenomenon may be called a floating body effect.

To eliminate the floating body effect, there has been proposed a technique of making electrical conduction between a channel and a substrate (see, for example, Japanese Laid-open Patent Publication No. 2008-10876).

If electrical conduction is made between the channel and the substrate in order to eliminate the floating body effect, however, potential change in the channel region by a gate voltage may be reduced, which means that the advantage of the SOI structure may be lost.

SUMMARY OF THE INVENTION

According to one aspect, there is provided a semiconductor device including a transistor with fin structure. The semiconductor device includes: a channel layer disposed over a substrate, the channel layer being connected to the substrate via a semiconductor layer; a source layer disposed on a first side surface of the channel layer over the substrate, the source layer being separated from the substrate via a first insulating layer, the source layer serving as a source of the transistor; a drain layer disposed on a second side surface of the channel layer opposite to the first side surface over the substrate, the drain layer being separated from the substrate via a second insulating layer, the drain layer serving as a drain of the transistor; and a gate electrode including a first portion disposed over the channel layer and a second portion disposed between the substrate and the channel layer, the gate electrode serving as a gate of the transistor, wherein the second portion has a third side surface and a fourth side surface opposite to the third side surface, and the third side surface or the fourth side surface faces the semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, some embodiments will be described with reference to the accompanying drawings.

First Embodiment

Figure 1:
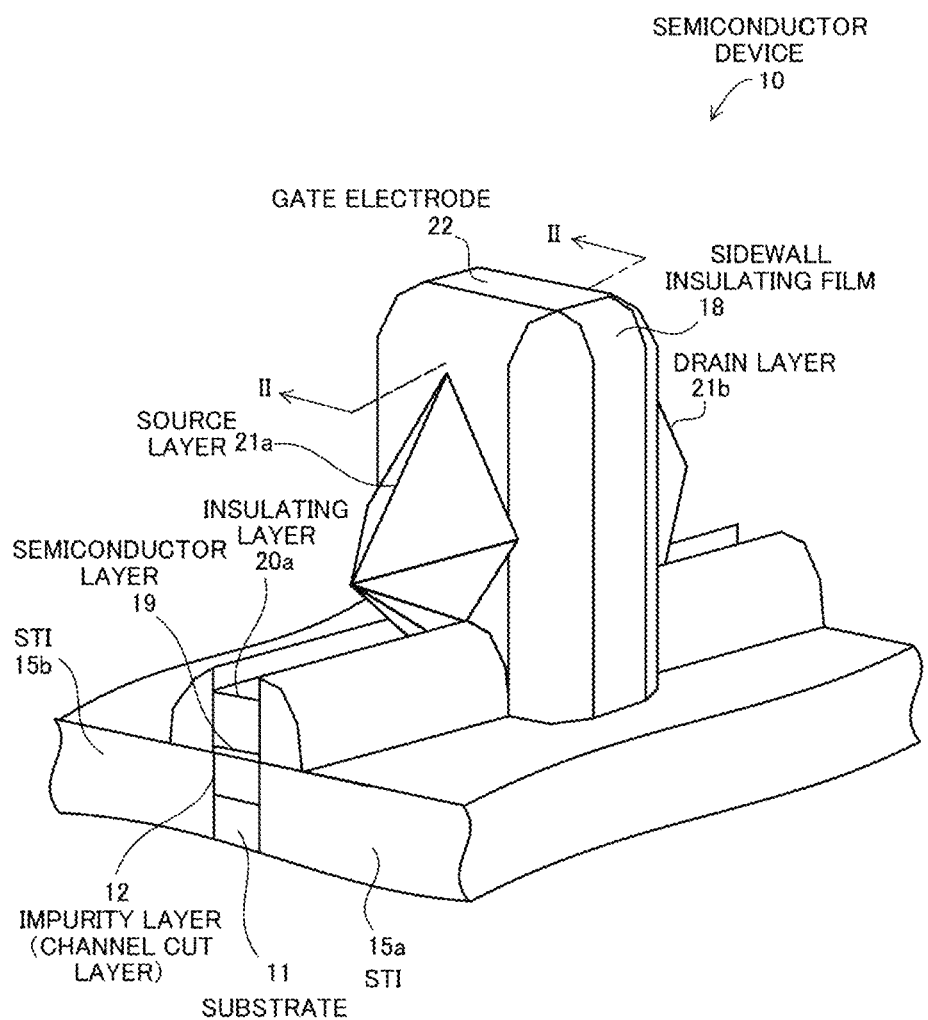
FIG. 1 is a perspective view illustrating an example of a semiconductor device according to a first embodiment.
Figure 2:
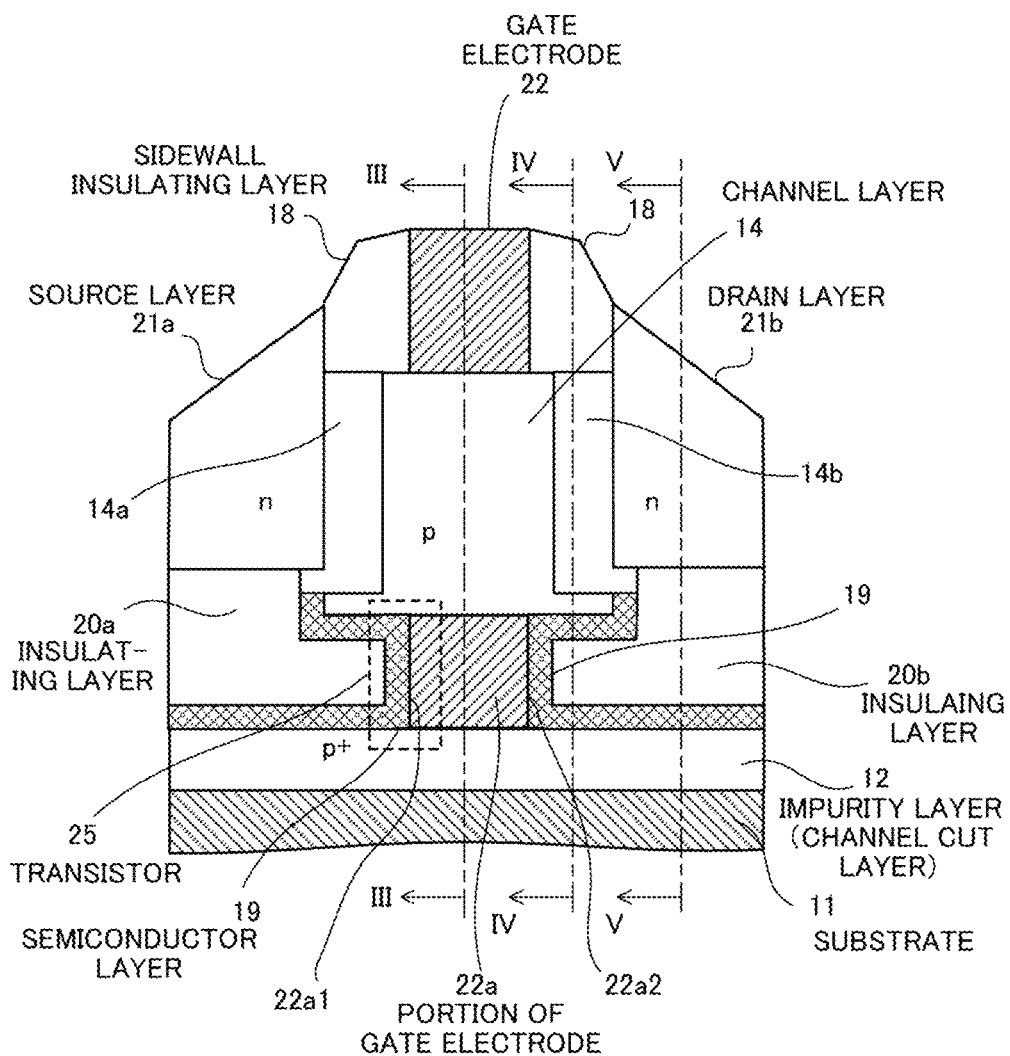
FIG. 2 is a sectional view taken along the line II-II of FIG. 1.
Figure 3:
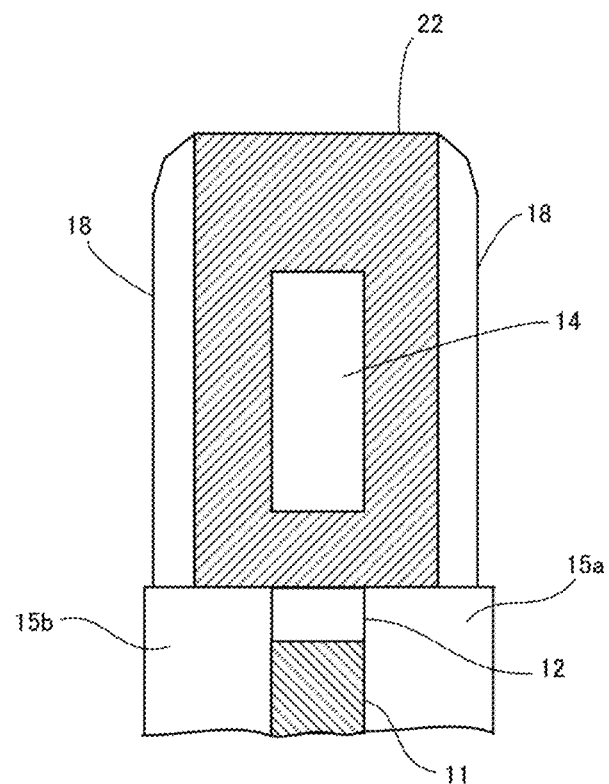
FIG. 3 is a sectional view taken along the line III-III of FIG. 2.
Figure 4:
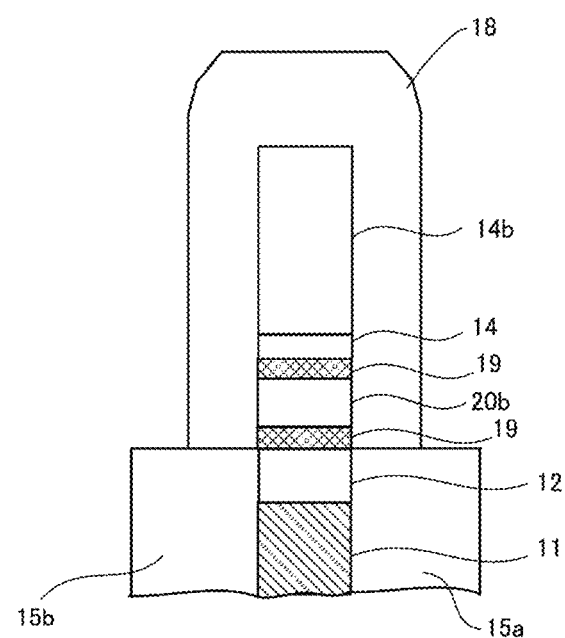
FIG. 4 is a sectional view taken along the line IV-IV of FIG. 2.
Figure 5:
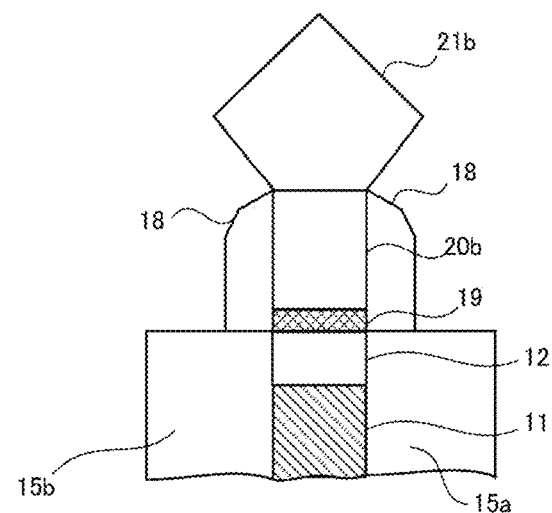
FIG. 5 is a sectional view taken along the line V-V of FIG. 2.

FIG. 1 is a perspective view illustrating an example of a semiconductor device according to a first embodiment. FIG. 2 is a sectional view taken along the line II-II of FIG. 1, FIG. 3 is a sectional view taken along the line III-III of FIG. 2, FIG. 4 is a sectional view taken along the line IV-IV of FIG. 2, and FIG. 5 is a sectional view taken along the line V-V of FIG. 2.

The semiconductor device 10 of the first embodiment has a transistor with fin structure formed by a channel layer 14 (see FIG. 2), a source layer 21a, a drain layer 21b, and a gate electrode 22, which are formed over a substrate 11.

For example, the substrate 11 is a silicon substrate. In addition, as illustrated in FIG. 2, an impurity layer (hereinafter, referred to as a channel cut layer) 12 is formed at the surface of the substrate 11. The channel cut layer 12 contains an impurity of the same conductivity type as that of the channel layer 14 with an impurity concentration higher than that of the channel layer 14. In the example of FIG. 2, the channel layer 14 is a p-type impurity region containing a p-type impurity, and the channel cut layer 12 is a p+-type impurity region with a p-type impurity concentration higher than that of the channel layer 14.

Note that the channel cut layer 12 does not need to be provided. However, the channel cut layer 12 is desirably provided in order to suppress a source-drain leakage current, as will be described later.

In addition, shallow trench isolations (STIs) 15a and 15b that electrically isolate adjacent elements from each other are formed in the substrate 11.

As illustrated in FIG. 2, the channel layer 14 is connected via a semiconductor layer 19 to the substrate 11 having the channel cut layer 12 formed at the surface thereof. In the example of FIG. 2, impurity diffusion regions 14a and 14b containing impurities diffused from the source layer 21a and drain layer 21b, respectively, are formed in the channel layer 14. The impurity diffusion regions 14a and 14b contain impurities of the same conductivity type as those of the source layer 21a and drain layer 21b (impurities of a different conductivity type from that of the channel layer 14) with impurity concentrations lower than those of the source layer 21a and drain layer 21b.

The source layer 21a serves as the source of the transistor with fin structure. The source layer 21a is disposed on a side surface of the channel layer 14 over the substrate 11 and is separated from the substrate 11 via the insulating layer 20a.

The drain layer 21b serves as the drain of the transistor with fin structure. The drain layer 21b is disposed on a side surface of the channel layer 14 opposite to the side surface on which the source layer 21a is disposed over the substrate 11 and is separated from the substrate 11 via the insulating layer 20b.

The source layer 21a and drain layer 21b contain impurities of a conductivity type (n-type in the example of FIG. 2) different from that of the channel layer 14.

The gate electrode 22 serves as the gate of the transistor with fin structure, and includes a first portion disposed over the channel layer 14 and a second portion (portion 22a in FIG. 2) disposed between the substrate 11 and the channel layer 14, as illustrated in FIG. 2. Here, the portion 22a has a side surface 22a1 and a side surface 22a2 opposite to the side surface 22a1, which face the semiconductor layer 19.

In addition, a sidewall insulating film 18 is formed on the side surface of the gate electrode 22.

In this connection, although not illustrated, a gate insulating film is formed between the portion of the gate electrode 22 over the channel layer 14 and the channel layer 14, between the portion 22a and the semiconductor layer 19, between the portion 22a and the channel layer 14, and between the portion 22a and the channel cut layer 12. For example, the gate insulating film is a silicon oxide film, a high-k film, or another. Materials for the high-k film are, but are not limited to, hafnium oxide (HfO$_2$), hafnium silicon oxide (Hf—Si—O), hafnium silicon oxynitride (HfSiON), and others.

For example, the semiconductor layer 19 is a silicon epitaxial layer, which is formed in a later-described manner. The semiconductor layer 19 is disposed between the insulating layer 20a and the side surface 22a1 and between the insulating layer 20b and the side surface 22a2, and connects the channel layer 14 and the substrate 11. In this connection, the semiconductor layer 19 may be disposed only on either the side surface 22a1 or 22a2.

In addition, as illustrated in FIG. 2, the semiconductor layer 19 may be disposed between the channel cut layer 12 and each insulating layer 20a and 20b and between each insulating layer 20a and 20b and the channel layer 14. Referring to the example of FIG. 2, parts of the top surfaces of the insulating layers 20a and 20b under the sidewall insulating film 18 formed on the side wall of the portion of the gate electrode 22 over the channel layer 14 contact the bottom surface of the semiconductor layer 19 formed on the bottom surface of the channel layer 14.

The semiconductor layer 19 may contain an impurity of an opposite conductivity type to that of the channel layer 14, may contain an impurity of the same conductivity type as that of the channel layer 14, or may contain an impurity of the same conductivity type as that of the channel layer 14 with the same impurity concentration as that of the channel layer 14 or an impurity concentration lower than that of the channel layer 14.

In addition, the semiconductor layer 19 may be a non-doped layer. In this connection, for example, the semiconductor layer 19 containing an n-type impurity or a p-type impurity with an impurity concentration of $1.0 \times 10^{15}$ cm$^{-3}$ or less may be said to be substantially a non-doped layer.

The above-described semiconductor device 10 has a transistor 25 that is of an opposite conductivity type to the fin-type transistor and that is formed by the substrate 11, channel layer 14, semiconductor layer 19, and the portion 22a of the gate electrode 22. In the transistor 25, the substrate 11 serves as one of the source and drain, the channel layer 14 serves as the other of the source and drain, the semiconductor layer 19 serves as the channel, and the portion 22a serves as the gate.

A similar transistor is provided at a side where the drain layer 21b is disposed.

When a voltage that turns on the transistor with fin structure is applied to the gate electrode 22, the density of carriers (electrons or positive holes) of the same conductivity type as that of the impurity of the channel layer 14 decreases in the semiconductor layer 19. Thereby, the transistor 25 goes into off state, and the channel layer 14 goes into a state (floating state) of being electrically isolated from the substrate 11. Therefore, potential change in the channel layer 14 by the gate voltage increases, and so a large source-drain current is obtained. That is, the advantage of the silicon-on-insulator (SOI) structure is obtained.

On the other hand, when a voltage that turns off the transistor with fin structure is applied to the gate electrode 22, the density of carriers of the same conductivity type as that of the impurity of the channel layer 14 increases in the semiconductor layer 19. Thereby, the transistor 25 goes into on state, and the channel layer 14 goes into a state of being electrically connected to the substrate 11. Therefore, the floating body effect is suppressed, which contributes to reducing characteristic variations, such as threshold voltage variation, due to the accumulation of electric charge dependent upon the most recent history of operation in the channel layer 14.

In the case where the transistor with fin structure is an n-channel metal-oxide-semiconductor field-effect transistor (MOSFET), the channel layer 14 contains a p-type impurity. In the case where the semiconductor layer 19 contains an n-type impurity and the substrate 11 contains a p-type impurity, the transistor 25 is a p-channel MOSFET. In this case, when a voltage (a positive voltage higher than or equal to a threshold) that turns on the fin-type transistor is applied to the gate electrode 22, good electrical isolation is obtained between the channel layer 14 and the substrate.

On the other hand, in the case where the semiconductor layer 19 contains a p-type impurity with the same impurity concentration as that of the channel layer 14 or an impurity concentration lower than that of the channel layer 14 and the substrate 11 contains a p-type impurity, the transistor 25 is a depression-type p-channel MOSFET. In this case, the insulation between the channel layer 14 and the substrate 11 during application of a positive voltage higher than or equal to the threshold to the gate electrode 22 is worse than the above case of the transistor 25 being a p-channel MOSFET. In the case of the transistor 25 being a depression-type p-channel MOSFET, however, the channel layer 14 and the substrate 11 have a lower resistance connection therebetween when a voltage (0 V) that turns off the fin-type transistor is applied to the gate electrode 22. This further improves an effect of reducing the floating body effect.

In addition, the source layer 21a and drain layer 21b are insulated from the substrate 11 by the insulating layers 20a and 20b, which prevents a source-drain leakage current that flows through the upper portion of the substrate 11 and which also reduces the capacity between the source layer 21a and the substrate 11 and the capacity between the drain layer 21b and the substrate 11.

In addition, parts of the top surfaces of the insulating layers 20a and 20b under the sidewall insulating film 18 illustrated in FIG. 2 contact the bottom surface of the semiconductor layer 19 formed on the bottom surface of the channel layer 14. In other words, the semiconductor layer 19 is formed on the bottom surface of the channel layer 14 under the sidewall insulating film 18. The semiconductor layer 19 allows the channel layer 14 to substantially have a partially increased thickness (length in the vertical direction), which provides an effect of reducing source-drain parasitic resistance. Note that the thickness of the channel layer 14 under the gate electrode 22 does not change, and therefore the controllability of the gate on the channel layer 14 does not change.

As described above, the semiconductor device 10 of the first embodiment is able to suppress the floating body effect without losing the advantage of the SOI structure.

First Comparative Example

Figure 6:
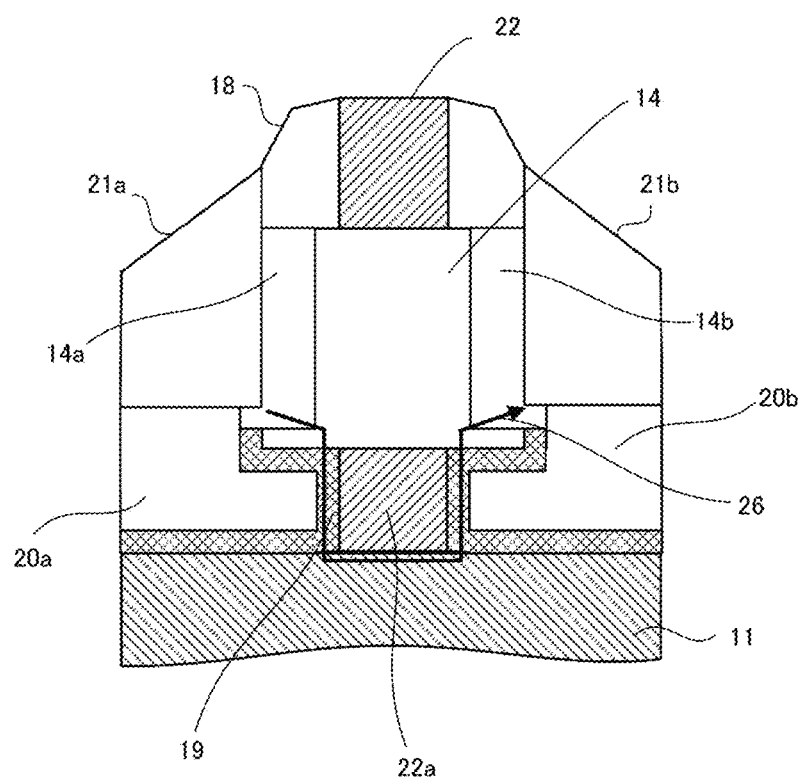
FIG. 6 illustrates an example of a semiconductor device without a channel cut layer.

FIG. 6 illustrates an example of a semiconductor device without a channel cut layer. The same reference numerals as used in FIG. 2 are given to the corresponding elements in FIG. 6.

Without the channel cut layer 12, a leakage current may flow from the source layer 21a through the channel layer 14, semiconductor layer 19, and substrate 11 to the drain layer 21b, as indicated by the arrow 26 of FIG. 6.

For this reason, the channel cut layer 12 is desirably provided as illustrated in FIG. 2.

Second Comparative Example

Figure 7:
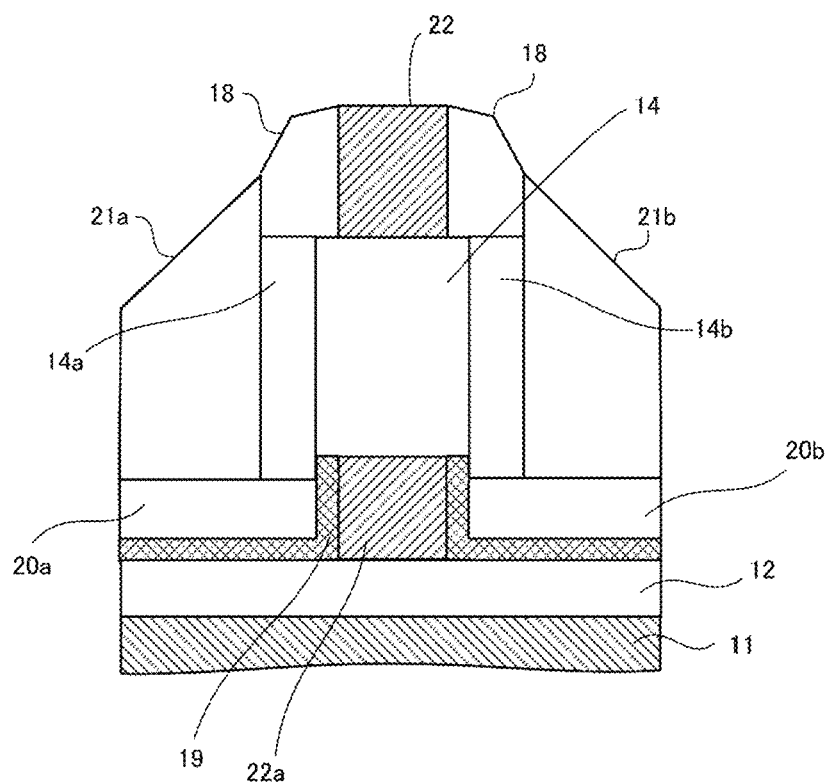
FIG. 7 illustrates an example of a semiconductor device in which the thickness of an insulating layer is a lower limit.

FIG. 7 illustrates an example of a semiconductor device in which the thickness of an insulating layer is a lower limit. The same reference numerals as used in FIG. 2 are given to the corresponding elements in FIG. 7.

Referring to the example of FIG. 7, the insulating layers 20a and 20b are thinner than those of FIG. 2. Parts of the top surfaces of the insulating layers 20a and 20b under the sidewall insulating film 18 of FIG. 7 contact the bottom surface of the channel layer 14 (in FIG. 7, the semiconductor layer 19 is integrated in the impurity diffusion regions 14a and 14b in the bottom surface portion of the channel layer 14). In this connection, the parts of the impurity diffusion regions 14a and 14b contacting the insulating layers 20a and 20b are parts formed by diffusing impurities from the source layer 21a and drain layer 21b into the semiconductor layer 19 in FIG. 7.

If the insulating layers 20a and 20b are further thinned, the following third comparative example is obtained.

Third Comparative Example

Figure 8:
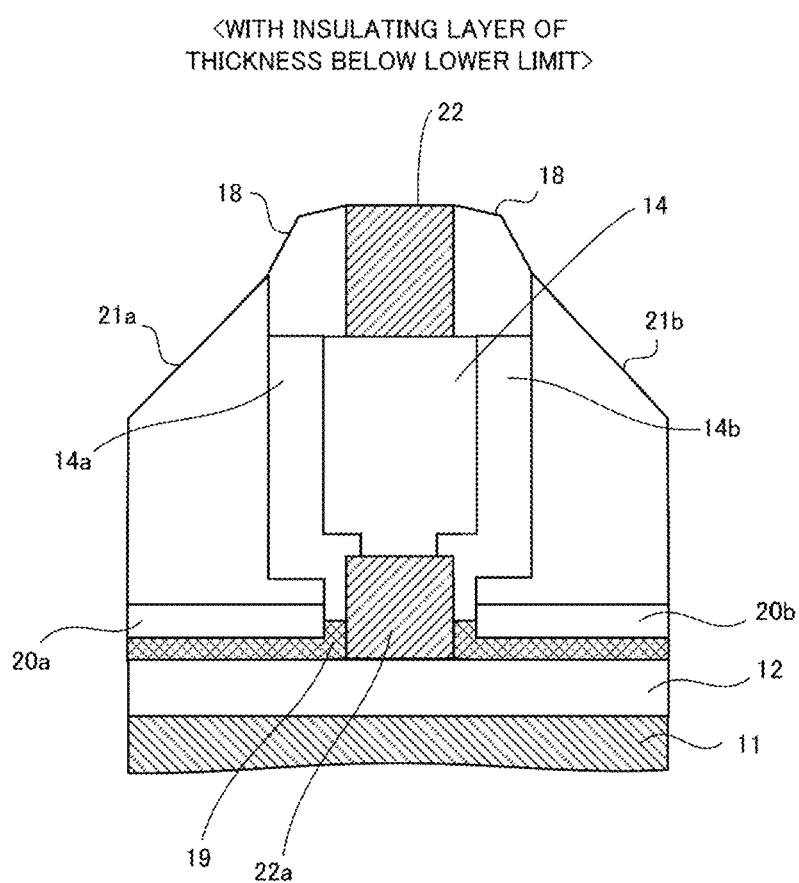
FIG. 8 illustrates an example of a semiconductor device in which the thickness of an insulating layer is below the lower limit.

FIG. 8 illustrates an example of a semiconductor device in which the thickness of an insulating layer is below the lower limit. The same reference numerals as used in FIG. 2 are given to the corresponding elements in FIG. 8.

Referring to the example of FIG. 8, the top surfaces of the insulating layers 20a and 20b are positioned lower than the bottom surface of the channel layer 14 illustrated in FIG. 7. In this case, the source layer 21a and drain layer 21b are interposed between the bottom surface of the channel layer 14 and the top surface of the insulating layer 20a and between the bottom surface of the channel layer 14 and the top surface of the insulating layer 20b, respectively, and therefore the distance between the source layer 21a and the drain layer 21b at the bottom of the channel layer 14 is reduced, which may arise a possibility of a source-drain leakage current.

For this reason, the thicknesses of the insulating layers 20a and 20b are desirably set such that the top surfaces of the insulating layers 20a and 20b under the sidewall insulating film 18 are positioned at the same height as or higher than the bottom surface of the channel layer 14. However, if the insulating layers 20a and 20b are made too thick, this leads to thinning the source layer 21a and drain layer 21b, reducing the contact areas between the channel layer 14 and each of the source layer 21a and drain layer 21b, and narrowing the path through which the source-drain current flows (higher resistance). For this reason, for example, in the case where the channel layer 14 has a thickness of 30 nm, the insulating layers 20a and 20b are desirably formed to have such thicknesses that the top surfaces of the insulating layers 20a and 20b are positioned higher by approximately 5 nm than the bottom surface of the channel layer 14.

(Method of Manufacturing Semiconductor Device 10)

The following describes an example of a method of manufacturing the semiconductor device 10 according to the first embodiment.

FIGS. 9 to 19 are perspective views illustrating steps included in the semiconductor device manufacturing method according to the first embodiment.

Figure 9:
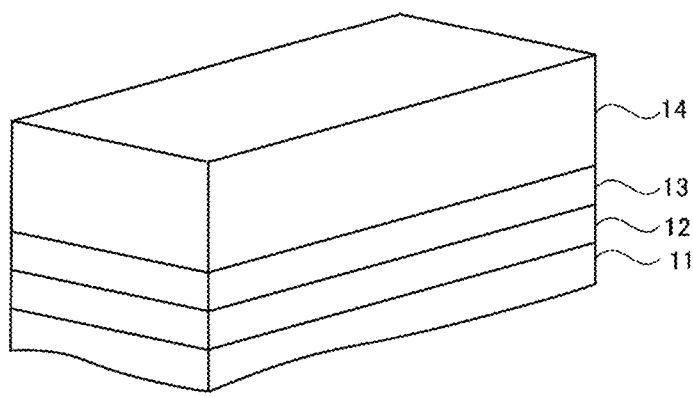
FIG. 9 is a perspective view illustrating one step included in a semiconductor device manufacturing method according to the first embodiment (part 1)

In the following example of the manufacturing method, a silicon substrate is used as the substrate 11. As illustrated in FIG. 9, an impurity is first implanted in the surface of the substrate 11 so as to form the channel cut layer 12 that contains an impurity of the same conductivity type as that of the later-formed channel layer 14 with an impurity concentration higher than that of the channel layer 14.

Techniques for the impurity implantation include ion implantation, gas-phase doping, plasma doping, plasma-immersion ion implantation, cluster doping, infusion doping, liquid-phase doping, solid-state doping, and others. N-type impurities include phosphorous (P), arsenic (As), and others. P-type impurities include boron (B), boron difluoride ($BF_2$), gallium (Ga), indium (In), and others.

Then, a silicon germanium (SiGe) epitaxial layer 13 is formed on the channel cut layer 12 by epitaxial growth, and a non-doped silicon channel layer 14 is formed on the epitaxial layer 13 by further epitaxial growth. Techniques for the epitaxial growth include vapor-phase epitaxy (VPE), molecular beam epitaxy (MBE), liquid phase epitaxy (LPE), and others.

For example, the silicon germanium epitaxial layer 13 has a thickness of 5 to 10 nm, and the channel layer 14 has a thickness of 30 to 50 nm.

Figure 10:
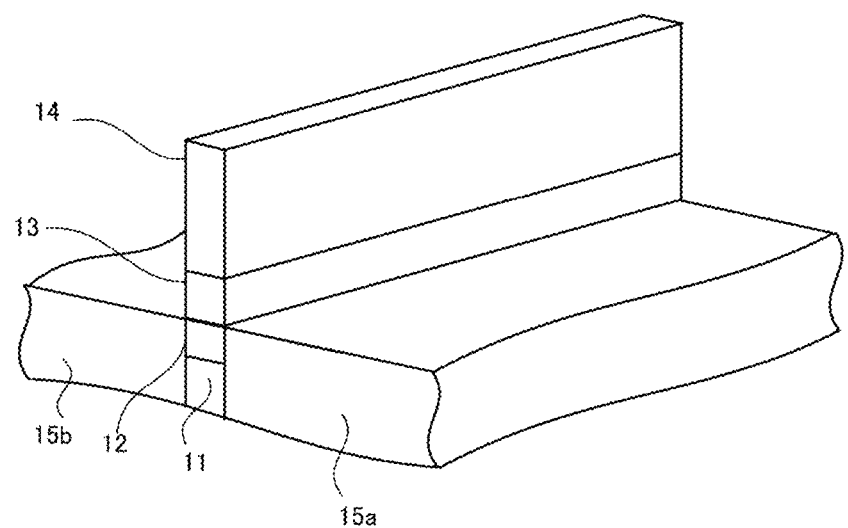
FIG. 10 is a perspective view illustrating one step included in the semiconductor device manufacturing method according to the first embodiment (part 2)

After that, an etching process is performed on the laminated structure illustrated in FIG. 9 so as to form STI formation regions with, for example, a depth of approximately 30 to 50 nm in the substrate 11. Then, for example, a high density plasma (HDP)-chemical vapor deposition (CVD) process is performed on the structure after the etching process, so as to embed a silicon oxide film in the STI formation regions. In addition, a flattening process by chemical mechanical polishing (CMP) and hydrofluoric acid treatment (HF) are performed so as to make the silicon oxide film retreated and to form a fin structure and STIs 15a and 15b as illustrated in FIG. 10. The STIs 15a and 15b are formed such that their top surfaces are flush with the bottom surface of the silicon germanium epitaxial layer 13.

Then, an impurity is implanted in the channel layer 14. Here, a p-type impurity is implanted in the case where the transistor with fin structure is an n-channel MOSFET, and an n-type impurity is implanted in the case where the transistor with fin structure is a p-channel MOSFET. In this connection, the impurity implantation in the channel layer 14 may be performed when the channel layer 14 is formed by the epitaxial growth. Furthermore, for example, in the case where the p-type impurity is implanted in advance in the channel layer 14 for the n-channel MOSFET during the epitaxial growth, an n-type impurity may additionally be implanted at this time point in a region of the channel layer 14 where a p-channel MOSFET is to be formed. Similarly, for example, in the case where the n-type impurity is implanted in advance in the channel layer 14 for the p-channel MOSFET during the epitaxial growth, a p-type impurity may additionally be implanted at this time point in a region of the channel layer 14 where an n-channel MOSFET is to be formed.

In this connection, in the case where the p-type impurity is implanted in the channel layer 14, a channel region (inversion layer) that is converted to n-type when the transistor with fin structure is in on state is formed in the channel layer 14. Similarly, in the case where the n-type impurity is implanted in the channel layer 14, a channel region that is converted to p-type when the transistor with fin structure is in on state is formed in the channel layer 14.

Then, thermal oxidation is performed to form a gate oxide film (not illustrated) with, for example, a thickness of approximately 1 to 3 nm on the side surface and top surface of the laminated structure formed of the silicon germanium epitaxial layer 13 and channel layer 14 illustrated in FIG. 10. In addition, the CVD process is performed to deposit a polysilicon film and a hard mask layer in order. The hard mask layer is a silicon nitride (SiN) film or a silicon oxide film, for example. Then, an etching process is performed on the laminated film formed of the polysilicon film and hard mask layer. In this connection, when the etching reaches the gate oxide film, the etching process is stopped so as not to remove the gate oxide film.

Figure 11:
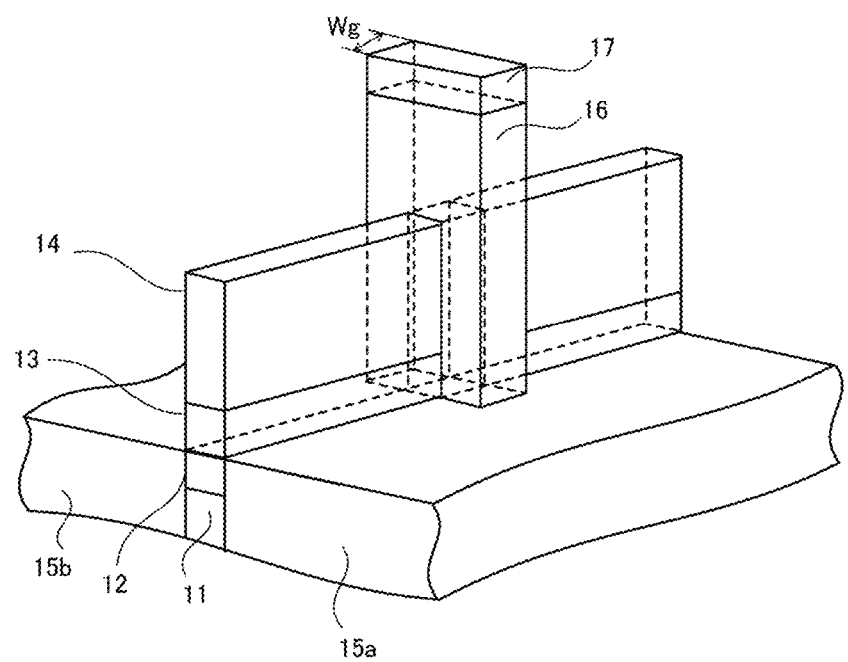
FIG. 11 is a perspective view illustrating one step included in the semiconductor device manufacturing method according to the first embodiment (part 3)

The etching process involves such patterning that the polysilicon film straddles the fin structure, so that a dummy electrode (hereinafter, referred to as a dummy gate) 16 and a hard mask 17 disposed on the dummy gate 16 are formed as illustrated in FIG. 11. For example, the dummy gate 16 is formed to have a gate width Wg of approximately 10 to 14 nm.

In this connection, the dummy gate 16 is replaced with the gate electrode 22 (except the portion 22a of FIG. 2) in a later-described step.

Figure 12:
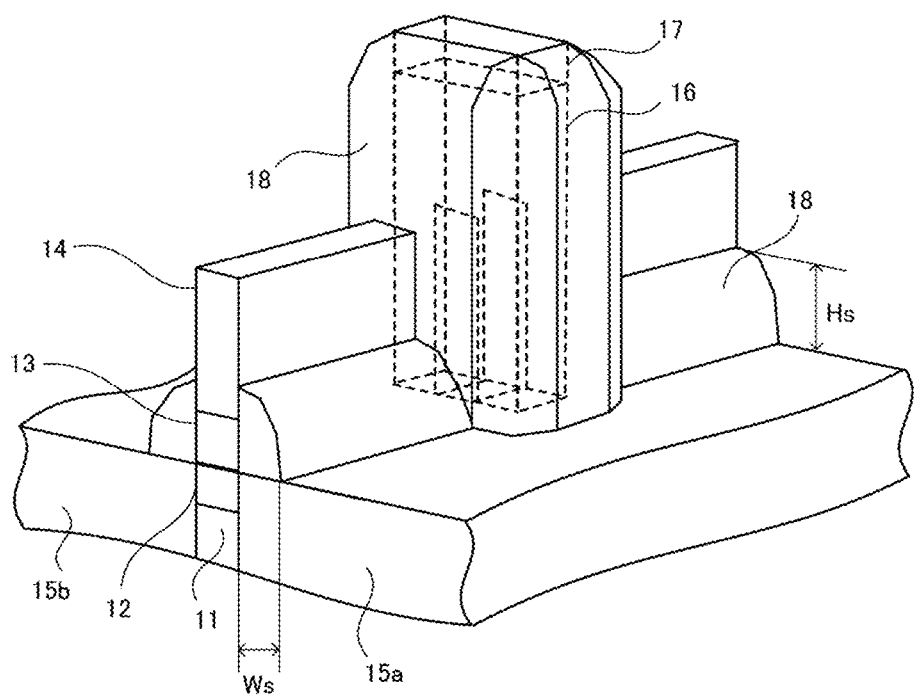
FIG. 12 is a perspective view illustrating one step included in the semiconductor device manufacturing method according to the first embodiment (part 4)

After that, in order to form the sidewall insulating film 18, the CVD process is performed to deposit a silicon nitride film on the structure illustrated in FIG. 11, for example. Then, anisotropic etching is performed to etch back the silicon nitride film such that the silicon nitride film remains on the side walls of the silicon germanium epitaxial layer 13, channel layer 14, dummy gate 16, and hard mask 17, thereby forming the sidewall insulating film 18 as illustrated in FIG. 12.

In this connection, the sidewall insulating film 18 has a width Ws of approximately 8 to 12 nm, for example. In addition, the sidewall insulating film 18 formed on the side walls of the silicon germanium epitaxial layer 13 and channel layer 14 has a height Hs that is greater than the thickness of the silicon germanium epitaxial layer 13 so as to use the sidewall insulating film 18 as a mask for etching the channel layer 14 in a later-described process. For example, the height Hs is approximately 10 to 15 nm.

In order to form the sidewall insulating film 18 by the above etch-back, the silicon nitride film is deposited to have a thickness greater by approximately 30% than the target thickness Ws in the deposition step.

Figure 13:
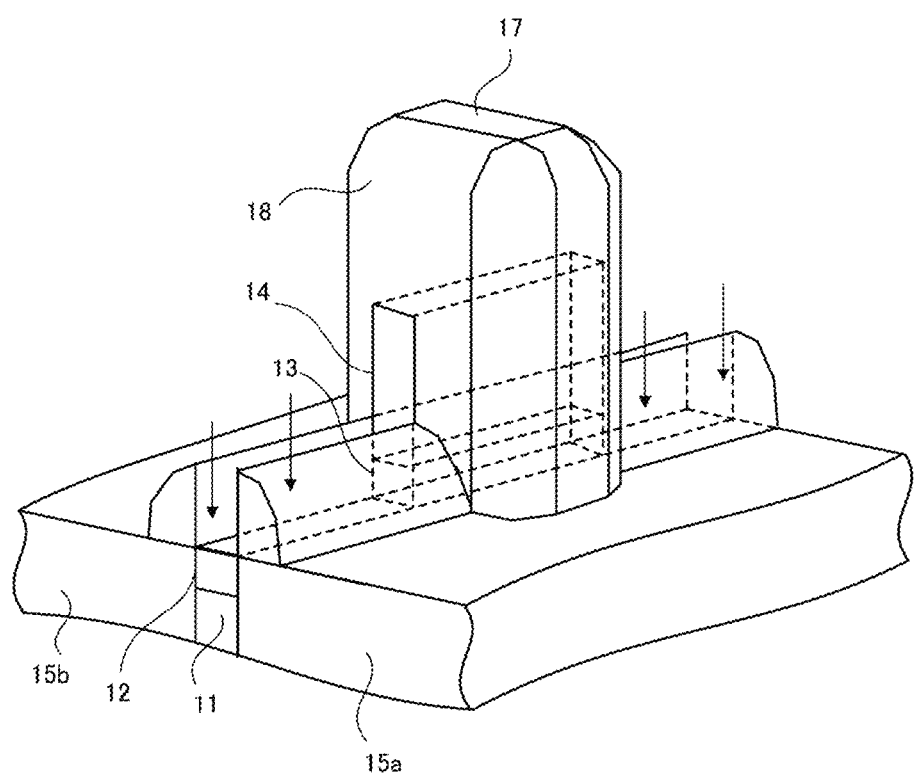
FIG. 13 is a perspective view illustrating one step included in the semiconductor device manufacturing method according to the first embodiment (part 5)

Then, using the hard mask 17 and sidewall insulating film 18 as masks, the anisotropic etching is performed in the arrow direction illustrated in FIG. 13. Thereby, portions of the silicon germanium epitaxial layer 13 and channel layer 14 other than those masked by the hard mask 17 and sidewall insulating film 18 are removed. In this connection, the dummy gate 16 is not illustrated in FIG. 13 and subsequent drawings.

Figure 14:
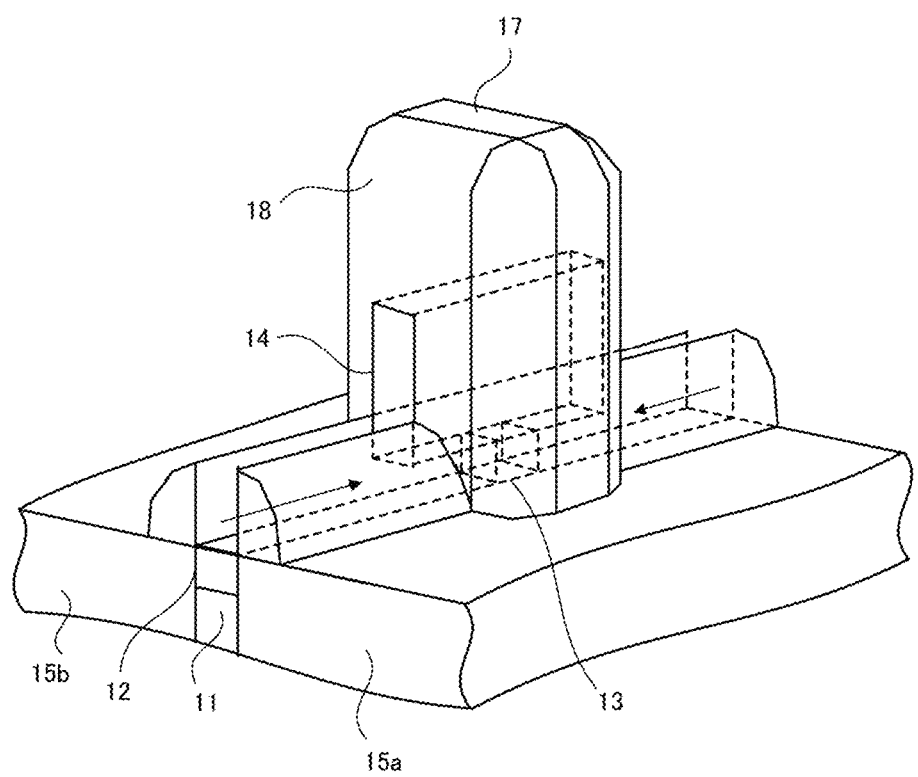
FIG. 14 is a perspective view illustrating one step included in the semiconductor device manufacturing method according to the first embodiment (part 6)

After the anisotropic etching, isotropic etching is performed on the silicon germanium epitaxial layer 13 remaining on the bottom surface of the channel layer 14 such that only the central portion of the silicon germanium epitaxial layer 13 under the bottom surface of the channel layer 14 (the portion sandwiched by the lower portions of the dummy gate 16) remains, as illustrated in FIG. 14.

At this time, if the width of the remaining epitaxial layer 13 is much greater than the gate width Wg, the following problem would occur: in a later-described step of further removing the remaining epitaxial layer 13 and embedding a metal material for the gate electrode 22 in the removed space, the metal material may fail to fill the space properly. If this happens, the gate electrode 22 and the semiconductor layer 19 may be separated from each other. With the separation, the gate potential is unable to affect the semiconductor layer 19, which may fail to obtain the functions of the above-described transistor 25.

For this reason, the etching time is desirably adjusted so that the width of the remaining epitaxial layer 13 is the same as the gate width Wg or less than the gate width Wg considering a process margin. In the following, assume that the width of the remaining epitaxial layer 13 is the same as the gate width Wg.

Figure 15:
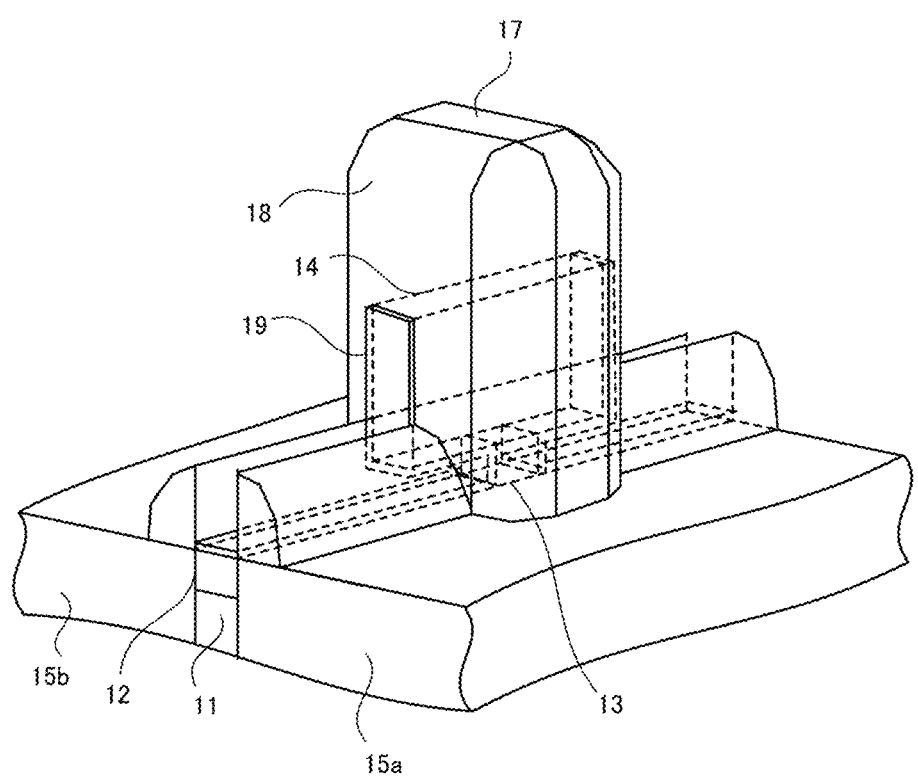
FIG. 15 is a perspective view illustrating one step included in the semiconductor device manufacturing method according to the first embodiment (part 7)

Then, using the above-described technique for the epitaxial growth, a silicon semiconductor layer 19 is formed on the top surface of the channel cut layer 12, the exposed side surfaces of the silicon germanium epitaxial layer 13, and the exposed side surfaces and exposed bottom surface of the channel layer 14, as illustrated in FIG. 15. The semiconductor layer 19 is formed to have a thickness of 1 to 5 nm, for example.

In the semiconductor layer 19, an impurity of an opposite conductivity type to that of the channel layer 14 may be implanted, or an impurity of the same conductivity type as that of the channel layer 14 may be implanted with an impurity concentration lower than or the same as that of the channel layer 14, as described earlier. In this connection, an n-type or p-type impurity does not need to be implanted in the semiconductor layer 19. For example, in the case where the semiconductor layer 19 contains an n-type or p-type impurity with an impurity concentration of $1.0 \times 10^{15}$ cm$^{-3}$ or less, the semiconductor layer 19 may be treated as a non-doped layer in which no impurity is substantially implanted.

Figure 16:
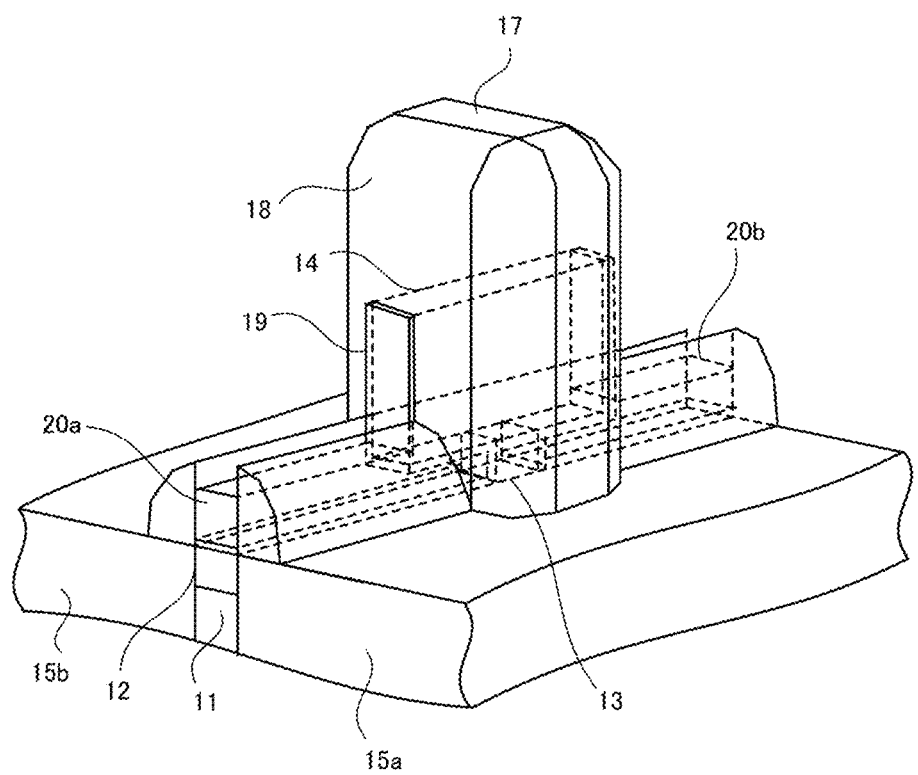
FIG. 16 is a perspective view illustrating one step included in the semiconductor device manufacturing method according to the first embodiment (part 8)

Then, as illustrated in FIG. 16, insulating layers 20a and 20b that are silicon oxide films are embedded in regions sandwiched by the sidewall insulating film 18 and regions under the channel layer 14 (where the silicon germanium epitaxial layer 13 has been removed). To achieve proper embedding here, deposition of a silicon oxide film and etching may be combined as appropriate. For example, the deposition of a silicon oxide film by the CVD process, the anisotropic etching, and the HDP-CVD process may be performed in this order. The anisotropic etching may be performed at the end.

In the case where the silicon oxide film remains on the side walls of the semiconductor layer 19 formed on the side surfaces of the channel layer 14, the silicon oxide film may be removed using hydrofluoric acid or the like, for example.

Figure 17:
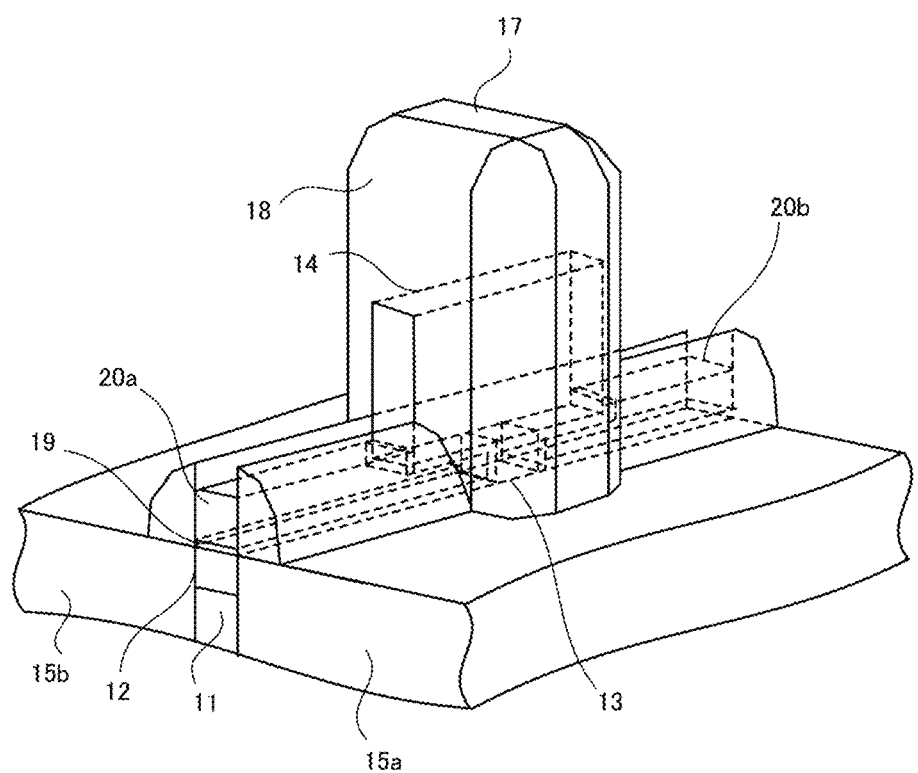
FIG. 17 is a perspective view illustrating one step included in the semiconductor device manufacturing method according to the first embodiment (part 9)

Then, the semiconductor layer 19 formed on the side surfaces of the channel layer 14 may be removed (see FIG. 17). To remove the semiconductor layer 19, the isotropic etching may be performed or the anisotropic etching may be performed using the hard mask 17 and sidewall insulating film 18 as masks. The reason why the semiconductor layer 19 formed on the side surfaces of the channel layer 14 is removed will be described later (with reference to FIG. 21).

Figure 18:
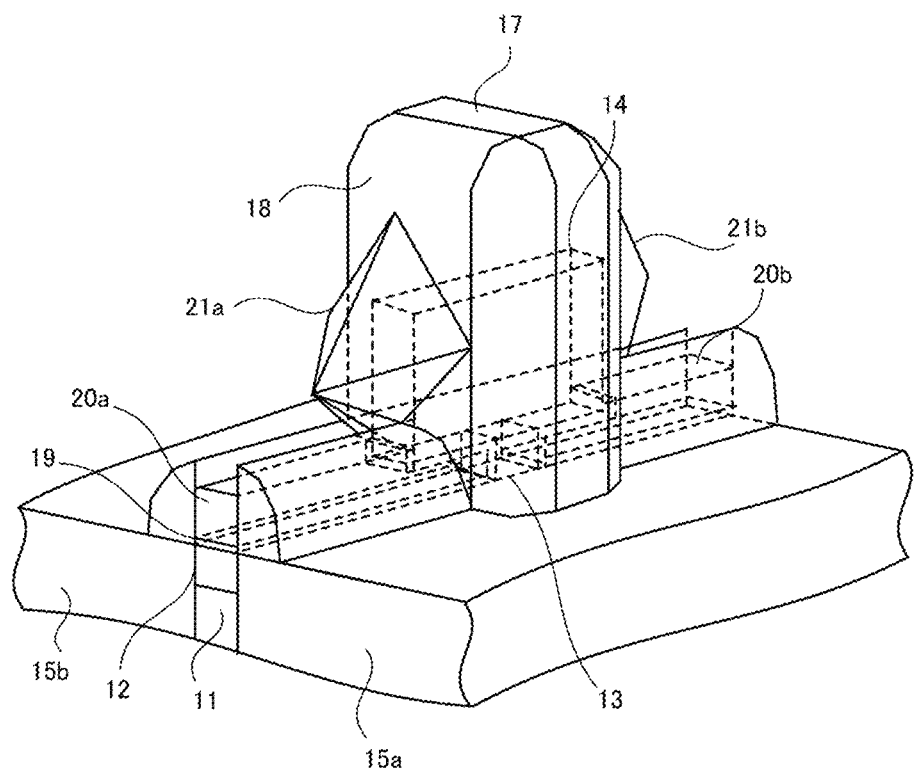
FIG. 18 is a perspective view illustrating one step included in the semiconductor device manufacturing method according to the first embodiment (part 10)

Then, as illustrated in FIG. 18, a source layer 21a and a drain layer 21b are formed. The source layer 21a and drain layer 21b are formed on two opposite side surfaces of the channel layer 14 by the epitaxial growth. The shapes of the formed source layer 21a and drain layer 21b depend on the crystal faces and others of these two side surfaces of the channel layer 14 on which the epitaxial growth is performed for the source layer 21a and drain layer 21b. In addition, an impurity of an opposite conductivity type to that of the channel layer 14 is implanted in the source layer 21a and drain layer 21b.

Then, although not illustrated, for example, the CVD process is performed to deposit a silicon oxide film, as an inter-layer insulating film, which covers the structure illustrated in FIG. 18. Then, the CMP is performed to flatten the silicon oxide film.

In the case where the hard mask 17 is a silicon oxide film, the hard mask 17 is removed by the CMP as well, so that the top surface of the polysilicon dummy gate 16 is exposed.

In the case where the hard mask 17 is a silicon nitride film, the top surface of the hard mask 17 is exposed by the CMP. After that, the hard mask 17, which is a silicon nitride film, is etched using the silicon oxide film that is an inter-layer insulating film as a mask so as to remove the hard mask 17 and thereby expose the top surface of the polysilicon dummy gate 16.

Figure 19:
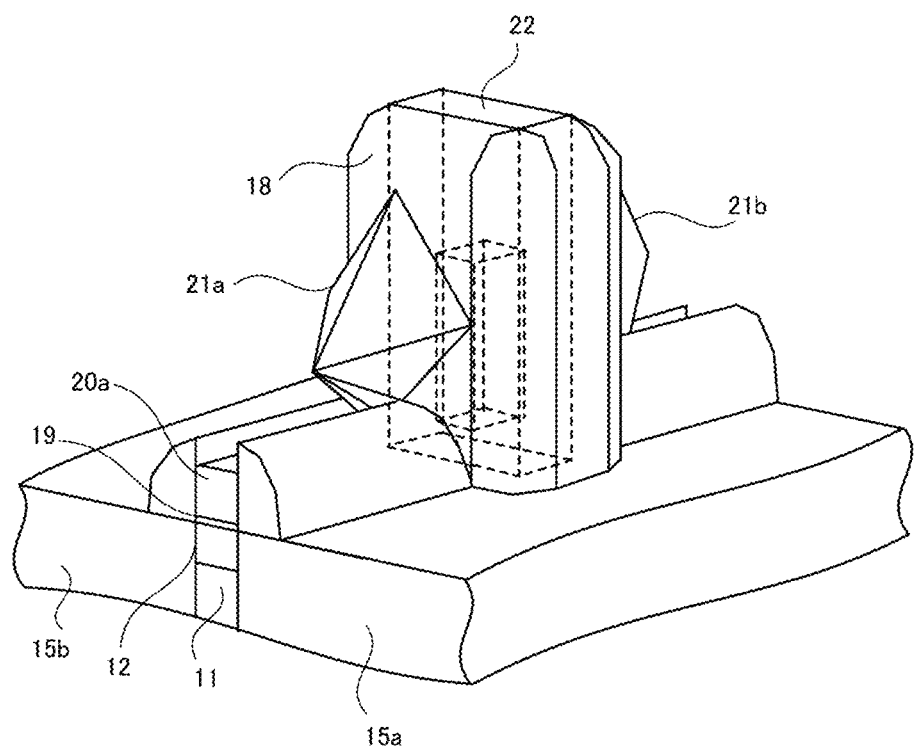
FIG. 19 is a perspective view illustrating one step included in the semiconductor device manufacturing method according to the first embodiment (part 11)

After that, a replacement metal gate (RMG) step is executed to replace the dummy gate 16 and the silicon germanium epitaxial layer 13 remaining under the channel layer 14 with a gate electrode 22 (see FIG. 19). In this connection, the channel layer 14 is not illustrated in FIG. 19.

In the RMG step, the dummy gate 16 is removed by gas-phase etching, wet etching, or another. The gate oxide film, not illustrated, protects the channel layer 14 and others during the removal of the dummy gate 16. Then, after the gate oxide film is removed by a hydrofluoric acid treatment or another, the epitaxial layer 13 remaining under the channel layer 14 is removed by the isotropic etching. After that, a gate insulating film, not illustrated, is formed on the surfaces of the channel layer 14 and substrate 11 exposed in the spaces where the dummy gate 16 and epitaxial layer 13 have been removed. In addition, a metal material fills the area where the dummy gate 16 and hard mask 17 have been removed and the area where the epitaxial layer 13 remaining under the channel layer 14 has been removed, on the gate insulating film. Thereby, the gate electrode 22 as illustrated in FIG. 19 is formed.

For example, the gate insulating film is a silicon oxide film, a high-k film, or the like. Examples of the metal material for the gate electrode 22 include titanium nitride (TiN), titanium aluminide (TiAl), titanium aluminum nitride (TiAlN), tungsten (W), titanium (Ti), tantalum (Ta), ruthenium (Ru), zirconium (Zr), cobalt (Co), copper (Cu), and others. In addition, the gate electrode 22 may be formed of a combination of a plurality of metal materials.

The gate insulating film and gate electrode 22 may be formed by a deposition technique such as CVD, plating, atomic layer deposition (ALD), vapor deposition, or others.

With the above-described manufacturing method, the semiconductor device 10 as illustrated in FIGS. 1 to 5 is manufactured.

The following describes why the semiconductor layer 19 formed on the side surfaces of the channel layer 14 is removed.

Figure 20:
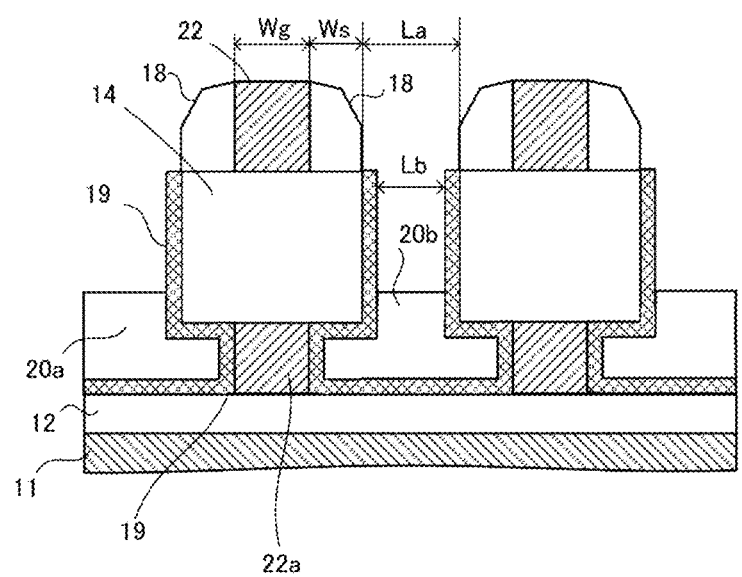
FIG. 20 illustrates an example of two adjacent transistors with fin structures.

FIG. 20 illustrates an example of two adjacent transistors with fin structures. In this connection, their source layers 21a and drain layers 21b are not illustrated in FIG. 20.

In the case where semiconductor layer 19 is not removed from the side surfaces of the channel layer 14, a space for forming a source layer 21a and a drain layer 21b between the two transistors with fin structures may be too narrow.

For example, in the example of FIG. 20, the gate electrodes 22 each have a gate width Wg of approximately 10 to 14 nm, and the sidewall insulating films 18 each have a width Ws of approximately 8 to 12 nm. For example, in the case where the inter-gate distance La between the two transistors with fin structures (the distance between the adjacent sidewall insulating films) is approximately 12 nm and the semiconductor layers 19 with a thickness of 1 to 2 nm are formed on the side surfaces of the channel layers 14, the distance Lb between the semiconductor layers on which the source layer 21a and drain layer 21b are formed is 8 to 10 nm, which is shorter by 20 to 30% than La.

For this reason, the semiconductor layer 19 on the side surfaces of the channel layer 14 is desirably removed before the source layer 21a and drain layer 21b are formed.

However, in the case where the distance La is long enough to form the source layer 21a and drain layer 21b, the semiconductor layer 19 does not need to be removed.

Fourth Comparative Example

Figure 21:
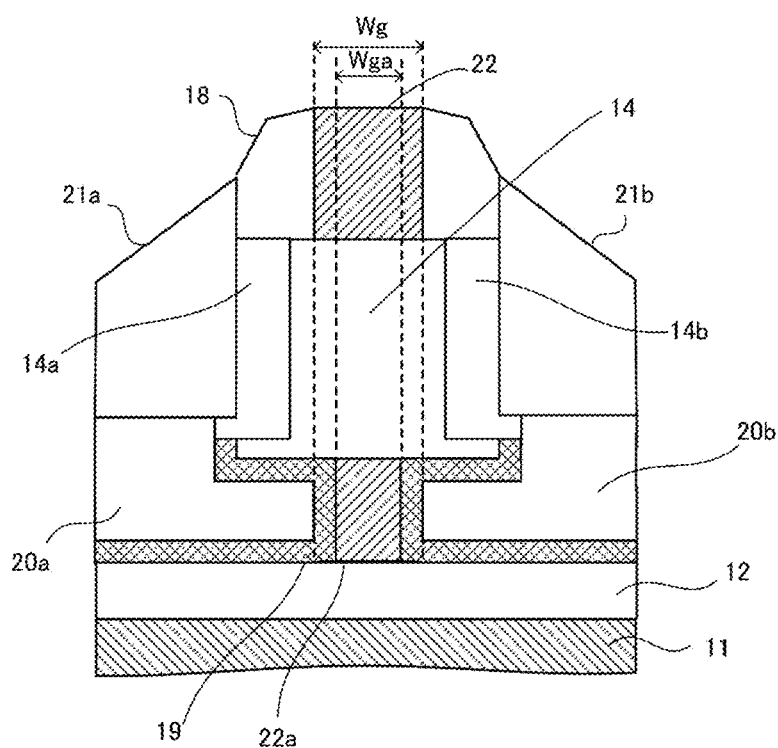
FIG. 21 is a sectional view illustrating an example of a semiconductor device in which the gate width under a channel layer is less than that over the channel layer.

FIG. 21 is a sectional view illustrating an example of a semiconductor device in which the gate width under a channel layer is less than that over the channel layer.

In the case where the etching time for the isotropic etching illustrated in FIG. 14 to remove the silicon germanium epitaxial layer 13 is adjusted so that the width of the remaining epitaxial layer 13 is less than the gate width Wg, the structure as illustrated in FIG. 21 is obtained. That is, the width Wga of the portion 22a of the gate electrode 22 under the channel layer 14 is less than the gate width Wg of the portion of the gate electrode 22 over the channel layer 14.

Second Embodiment

Figure 22:
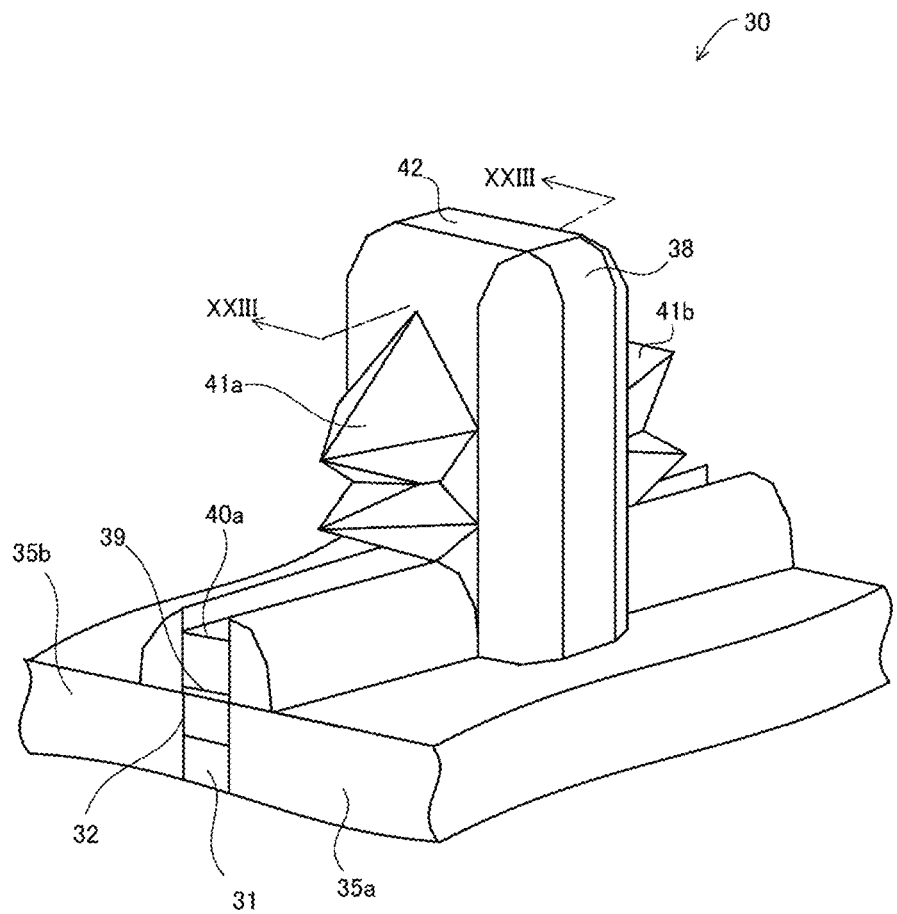
FIG. 22 is a perspective view illustrating an example of a semiconductor device according to a second embodiment.
Figure 23:
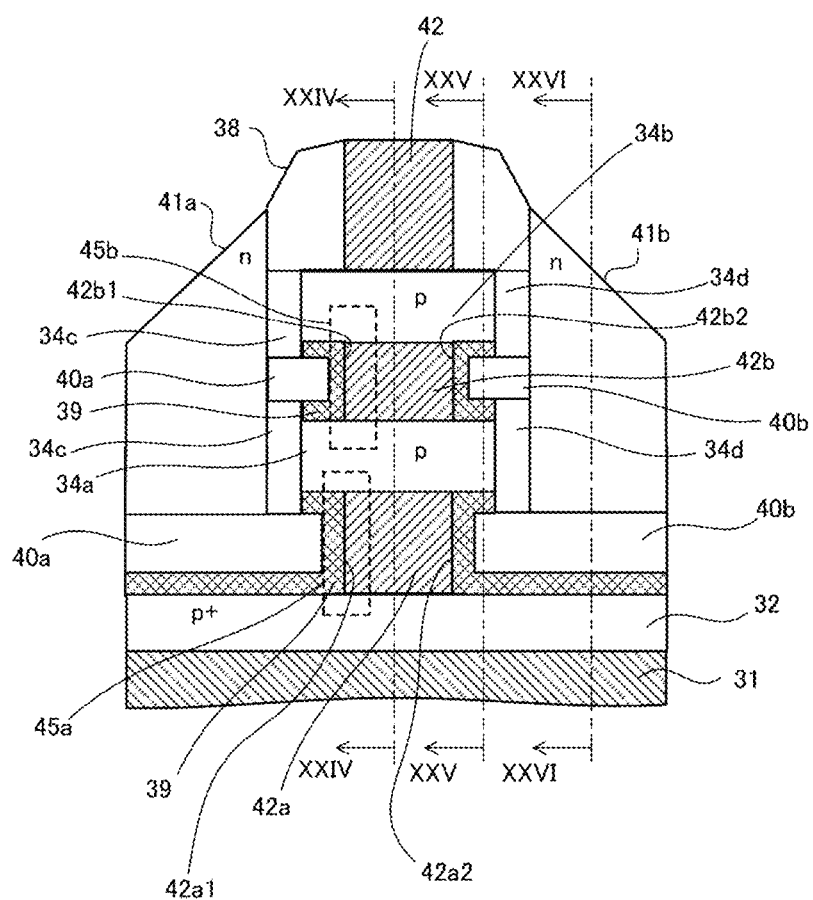
FIG. 23 is a sectional view taken along the line XXIII-XXIII of FIG. 22.
Figure 24:
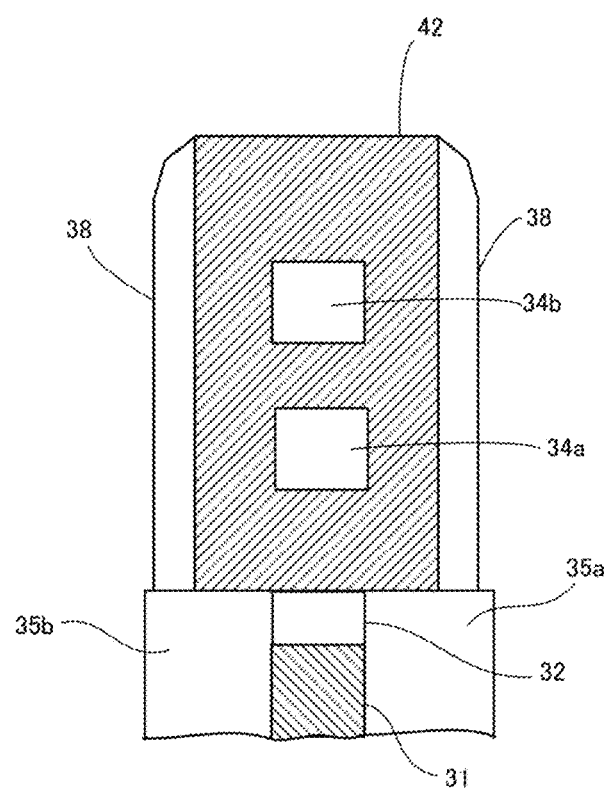
FIG. 24 is a sectional view taken along the line XXIV-XXIV of FIG. 23.
Figure 25:
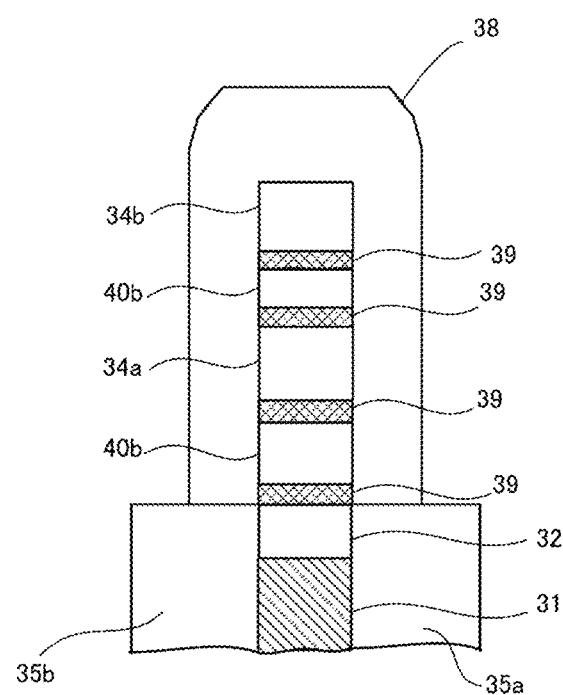
FIG. 25 is a sectional view taken along the line XXV-XXV of FIG. 23.
Figure 26:
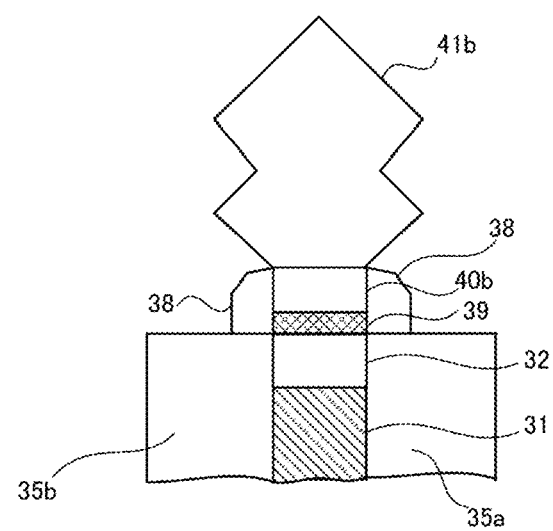
FIG. 26 is a sectional view taken along the line XXVI-XXVI of FIG. 23.

FIG. 22 is a perspective view illustrating an example of a semiconductor device according to a second embodiment. FIG. 23 is a sectional view taken along the line XXIII-XXIII of FIG. 22, FIG. 24 is a sectional view taken along the line XXIV-XXIV of FIG. 23, FIG. 25 is a sectional view taken along the line XXV-XXV of FIG. 23, and FIG. 26 is a sectional view taken along the line XXVI-XXVI of FIG. 23.

The semiconductor device 30 of the second embodiment has a transistor with fin structure formed by channel layers 34a and 34b (see FIG. 23), a source layer 41a, a drain layer 41b, and a gate electrode 42, which are formed over a substrate 31.

The substrate 31 is a silicon substrate, for example. In addition, as illustrated in FIG. 23, an impurity layer (hereinafter, referred to as a channel cut layer) 32 is formed at the surface of the substrate 31. The channel cut layer 32 contains an impurity of the same conductivity type as that of the channel layers 34a and 34b with an impurity concentration higher than that of the channel layers 34a and 34b. In the example of FIG. 23, the channel layers 34a and 34b are p-type impurity regions containing a p-type impurity, and the channel cut layer 32 is a p+-type impurity region with a p-type impurity concentration higher than that of the channel layers 34a and 34b.

Note that the channel cut layer 32 does not need to be provided. However, the channel cut layer 32 is desirably provided in order to suppress a source-drain leakage current, as will be described later.

In addition, STIs 35a and 35b that electrically isolate adjacent elements from each other are formed in the substrate 31.

As illustrated in FIG. 23, the channel layer 34a is connected via a semiconductor layer 39 to the substrate 31 having the channel cut layer 32 formed at the surface thereof. The channel layer 34b is connected via the semiconductor layer 39 and channel layer 34a to the substrate 31. In this connection, in the example of FIG. 23, impurity diffusion regions 34c and 34d containing impurities diffused from the source layer 41a and drain layer 41b are formed in the channel layers 34a and 34b. The impurity diffusion regions 34c and 34d contain impurities of the same conductivity type as those of the source layer 41a and drain layer 41b (impurities of a different conductivity type from that of the channel layers 34a and 34b) with impurity concentrations lower than those of the source layer 41a and drain layer 41b.

The source layer 41a serves as the source of the transistor with fin structure. The source layer 41a is disposed on side surfaces of the channel layers 34a and 34b over the substrate 31 and is separated from the substrate 31 via an insulating layer 40a.

The drain layer 41b serves as the drain of the transistor with fin structure. The drain layer 41b is disposed on side surfaces of the channel layers 34a and 34b opposite to the side surfaces on which the source layer 41a is disposed over the substrate 31 and is separated from the substrate 31 via an insulating layer 40b.

The source layer 41a and drain layer 41b contain impurities of a conductivity type (n-type in the example of FIG. 23) different from that of the channel layers 34a and 34b.

The gate electrode 42 serves as the gate of the transistor with fin structure, and as illustrated in FIG. 23, includes a first portion disposed over the channel layer 34b, a second portion (portion 42a in FIG. 23) disposed between the substrate 31 and the channel layer 34a, and a third portion (portion 42b in FIG. 23) disposed between the channel layer 34a and the channel layer 34b.

Here, the portion 42a has a side surface 42a1 and a side surface 42a2 opposite to the side surface 42a1, which face the semiconductor layer 39. Similarly, the portion 42b has a side surface 42b1 and a side surface 42b2 opposite to the side surface 42b1, which face the semiconductor layer 39.

In addition, a sidewall insulating film 38 is formed on the side surface of the gate electrode 42.

In this connection, although not illustrated, a gate insulating film is formed between the portion of the gate electrode 42 over the channel layer 34b and the channel layer 34b, between each portion 42a and 42b and the semiconductor layer 39, between the portion 42a and the channel layer 34a, between the portion 42b and each channel layer 34a and 34b, and between the portion 42a and the channel cut layer 32. The gate insulating film is a silicon oxide film, a high-k film, or another, for example.

For example, the semiconductor layer 39 is a silicon epitaxial layer, which is formed in a later-described manner. The semiconductor layer 39 is disposed between the insulating layer 40a and each side surface 42a1 and 42b1 and between the insulating layer 40b and each side surface 42a2 and 42b2, and connects the channel layers 34a and 34b and the substrate 31. In this connection, the semiconductor layer 39 may be disposed on only the side surfaces 42a1 and 42b1 or the side surfaces 42a2 and 42b2.

In addition, as illustrated in FIG. 23, the semiconductor layer 39 may be disposed between the channel cut layer 32 and each insulating layer 40a and 40b and between the insulating layers 40a and 40b and the channel layers 34a and 34b. Referring to the example of FIG. 23, parts of the top surfaces of the insulating layers 40a and 40b under the sidewall insulating film 38 formed on the side wall of the portion of the gate electrode 42 over the channel layer 34b contact the bottom surfaces of the semiconductor layer 39 formed on the bottom surfaces of the channel layers 34a and 34b.

The semiconductor layer 39 may contain an impurity of an opposite conductivity type to that of the channel layers 34a and 34b, may contain an impurity of the same conductivity type as that of the channel layers 34a and 34b, or may contain an impurity of the same conductivity type as that of the channel layers 34a and 34b with the same impurity concentration as that of the channel layers 34a and 34b or an impurity concentration lower than that of the channel layers 34a and 34b.

In addition, the semiconductor layer 39 may be a non-doped layer. In this connection, for example, the semiconductor layer 39 containing an n-type impurity or a p-type impurity with an impurity concentration of $1.0 \times 10_{15}$ cm$^{-3}$ or less may be said to be substantially a non-domed layer.

The above-described semiconductor device 30 has a transistor 45a that is of an opposite conductivity type to the fin-type transistor and that is formed by the substrate 31, channel layer 34a, the semiconductor layer 39, and the portion 42a of the gate electrode 42. In the transistor 45a, the substrate 31 serves as one of the source and drain, the channel layer 34a serves as the other of the source and drain, the semiconductor layer 39 serves as the channel, and the portion 42a serves as the gate.

In addition, the semiconductor device 30 also has a transistor 45b that is of an opposite conductivity type to the fin-type transistor and that is formed by the channel layer 34a, channel layer 34b, semiconductor layer 39, and the portion 42b of the gate electrode 42. In the transistor 45b, the channel layer 34a serves as one of the source and drain, the channel layer 34b serves as the other of the source and drain, the semiconductor layer 39 serves as the channel, and the portion 42b serves as the gate.

Similar transistors are provided at a side where the drain layer 41b is disposed.

When a voltage that turns on the fin-type transistor is applied to the gate electrode 42, the density of carriers (electrons or positive holes) of the same conductivity type as that of the impurity of the channel layers 34a and 34b decreases in the semiconductor layer 39. Thereby, the transistors 45a and 45b go into off state, and the channel layers 34a and 34b go into a state (floating state) of being electrically isolated from the substrate 31. Therefore, potential changes in the channel layers 34a and 34b by the gate voltage increase, and so a large source-drain current is obtained. That is to say, the advantage of the SOI structure is obtained.

On the other hand, when a voltage that turns off the transistor with fin structure is applied to the gate electrode 42, the density of carriers of the same conductivity type as that of the impurity of the channel layers 34a and 34b increases in the semiconductor layer 39. Thereby, the transistors 45a and 45b go into on state, and the channel layers 34a and 34b go into a state of being electrically connected to the substrate 31. Therefore, the floating body effect is suppressed, which contributes to reducing characteristic variations, such as threshold voltage variation, due to the accumulation of electric charge dependent upon the most recent history of operation in the channel layers 34a and 34b.

In the case where the transistor with fin structure is an n-channel MOSFET, the channel layers 34a and 34b contain a p-type impurity. In the case where the semiconductor layer 39 contains an n-type impurity and the substrate 31 contains a p-type impurity, the transistors 45a and 45b are p-channel MOSFETs. In this case, when a voltage (a positive voltage higher than or equal to a threshold) that turns on the transistor with fin structure is applied to the gate electrode 42, good electrical isolation is obtained between each channel layer 34a and 34b and the substrate.

On the other hand, in the case where the semiconductor layer 39 contains a p-type impurity with the same impurity concentration as that of the channel layers 34a and 34b or an impurity concentration lower than that of the channel layers 34a and 34b and the substrate 31 contains a p-type impurity, the transistors 45a and 45b are depression-type p-channel MOSFETs. In this case, the insulation between each channel layer 34a and 34b and the substrate 31 during application of a positive voltage higher than or equal to the threshold to the gate electrode 42 is worse than the above case of the transistors 45a and 45b being p-channel MOSFETs. In the case of the transistors 45a and 45b being depression-type p-channel MOSFETs, however, each channel layer 34a and 34b and the substrate 31 have a lower resistance connection therebetween when a voltage (0 V) that turns off the transistors with fin structures is applied to the gate electrode 42. This further improves an effect of reducing the floating body effect.

In addition, the source layer 41a and drain layer 41b are insulated from the substrate 31 by the insulating layers 40a and 40b, which prevents a source-drain leakage current that flows through the upper portion of the substrate 31 and which also reduces the capacity between the source layer 41a and the substrate 31 and the capacity between the drain layer 41b and the substrate 31.

In addition, parts of the top surfaces of the insulating layers 40a and 40b under the sidewall insulating film 38 illustrated in FIG. 23 contact the bottom surfaces of the semiconductor layer 39 formed on the bottom surfaces of the channel layers 34a and 34b. In other words, the semiconductor layer 39 is formed on the bottom surfaces of the channel layers 34a and 34b under the sidewall insulating film 38. The semiconductor layer 39 allows each channel layer 34a and 34b to substantially have a partially increased thickness (length in the vertical direction), which provides an effect of reducing source-drain parasitic resistance.

Note that the thicknesses of the channel layers 34a and 34b under the gate electrode 42 do not change, and therefore the controllability of the gate on the channel layers 34a and 34b does not change. Here, since the channel layers 34a and 34b of the semiconductor device 30 of the second embodiment are thinner than the channel layer 14 of the semiconductor device 10 of the first embodiment, the effect provided by the increase in the thickness using the semiconductor layer 39 in the semiconductor device 30 of the second embodiment is higher than that in the semiconductor device 10 of the first embodiment.

As described above, the semiconductor device 30 of the second embodiment is able to suppress the floating body effect without losing the advantage of the SOI structure.

In this connection, the above example describes the case where the two channel layers 34a and 34b are disposed. The number of channel layers is not limited thereto but may be set to three or more.

First Comparative Example

Figure 27:
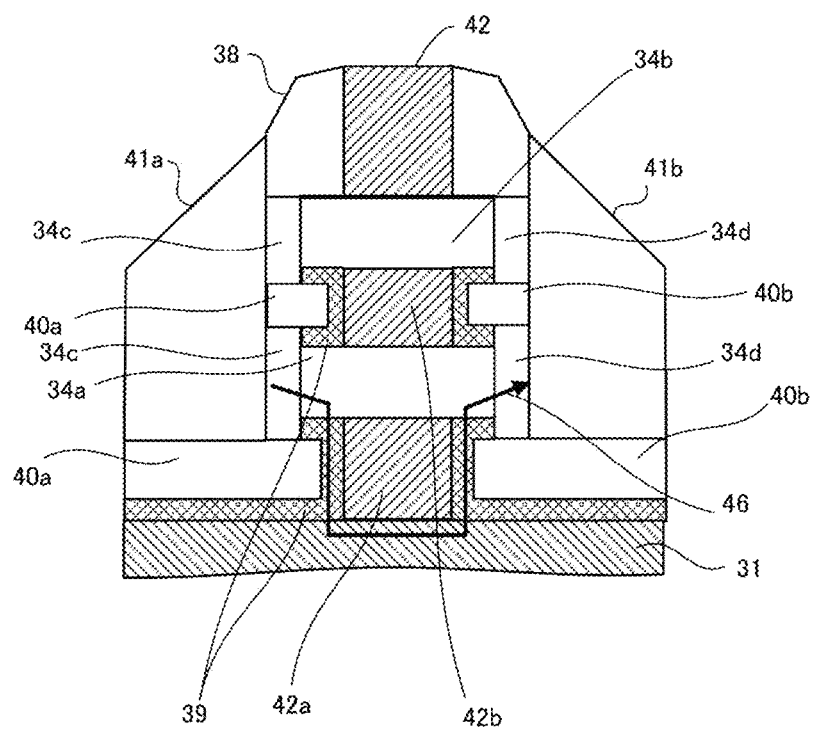
FIG. 27 illustrates an example of a semiconductor device without a channel cut layer.

FIG. 27 illustrates an example of a semiconductor device without a channel cut layer. The same reference numerals as used in FIG. 23 are given to the corresponding elements in FIG. 27.

Without the channel cut layer 32, a leakage current may flow from the source layer 41a through the channel layer 34a, semiconductor layer 39, and substrate 31 to the drain layer 41b, as indicated by the arrow 46 of FIG. 27.

For this reason, the channel cut layer 32 is desirably provided as illustrated in FIG. 23.

Second Comparative Example

Figure 28:
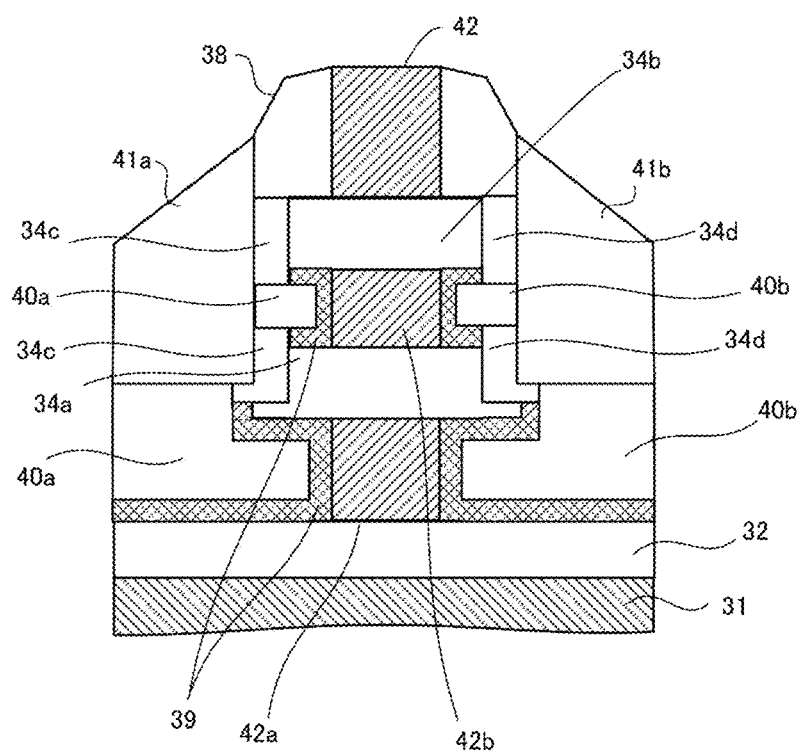
FIG. 28 illustrates an example of a semiconductor device with a thick insulating layer.

FIG. 28 illustrates an example of a semiconductor device with a thick insulating layer. The same reference numerals as used in FIG. 23 are given to the corresponding elements in FIG. 28.

Referring to the example of FIG. 28, the insulating layers 40a and 40b are thicker than those of FIG. 23. As the thicknesses of the insulating layers 40a and 40b increase, the source layer 41a and drain layer 41b become thinner, the contact areas between the channel layer 34a and each of the source layer 41a and drain layer 41b are reduced, and the path through which a source-drain current flows is narrowed (higher resistance). For this reason, the insulating layers 40a and 40b are desirably formed to have such thicknesses that the top surfaces of the thick portions of the insulating layers 40a and 40b are positioned higher by approximately 3 nm at most than the bottom surface of the semiconductor layer 39 (this portion serves as the channel layer 34a) disposed between the channel layer 34a and the thin portions of the insulating layers 40a and 40b.

Third Comparative Example

Figure 29:
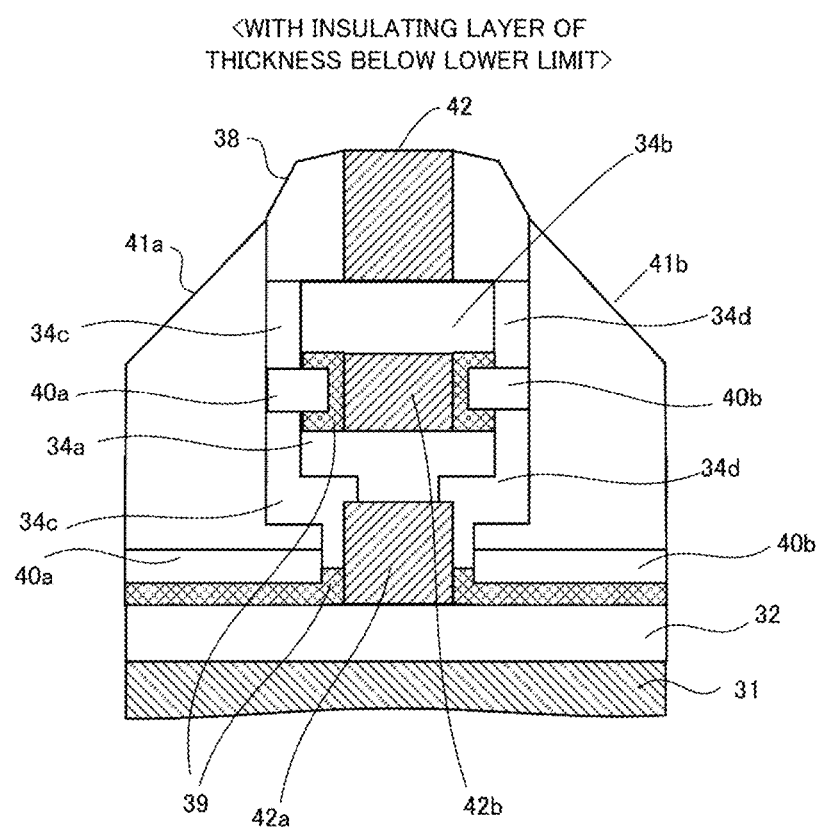
FIG. 29 illustrates an example of a semiconductor device in which the thickness of an insulating layer is below a lower limit.

FIG. 29 illustrates an example of a semiconductor device in which the thickness of an insulating layer is below a lower limit. The same reference numerals as used in FIG. 23 are given to the corresponding elements in FIG. 29.

Referring to the example of FIG. 29, the top surfaces of the insulating layers 40a and 40b are positioned lower than the bottom surface of a channel layer 34a (in FIG. 29, the semiconductor layer 39 forming the bottom surface portion of the channel layer 34a is integrated in the impurity diffusion regions 34c and 34d).

In this case, the source layer 41a and drain layer 41b are interposed between the bottom surface of the channel layer 34a and the top surface of the insulating layer 40a and between the bottom surface of the channel layer 34a and the top surface of the insulating layer 40b, respectively, and therefore the distance between the source layer 41a and the drain layer 41b at the bottom of the channel layer 34a is reduced, which may arise a possibility of a source-drain leakage current.

For this reason, the thicknesses of the insulating layers 40a and 40b are desirably set such that the top surfaces of the insulating layers 40a and 40b under the sidewall insulating film 38 are positioned at the same height as or higher than the bottom surface of the channel layer 34a (the bottom surface of the semiconductor layer 39 forming the bottom surface portion of the channel layer 34a).

(Method of Manufacturing Semiconductor Device 30)

The following describes an example of a method of manufacturing the semiconductor device 30 according to the second embodiment.

FIGS. 30 to 40 are perspective views illustrating steps included in the semiconductor device manufacturing method according to the second embodiment.

Figure 30:
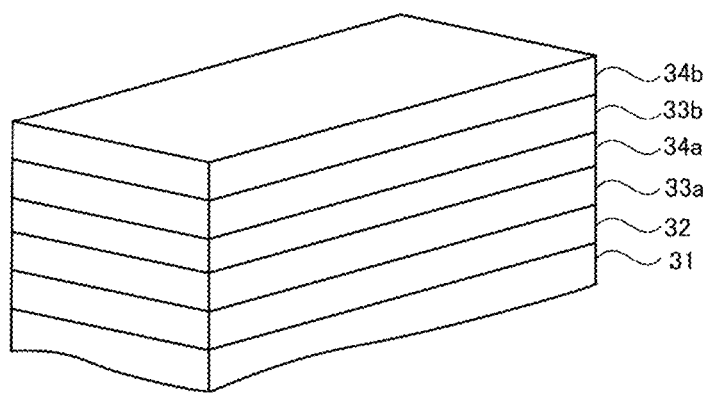
FIG. 30 is a perspective view illustrating one step included in a semiconductor device manufacturing method according to the second embodiment (part 1)

In the following example of the manufacturing method, a silicon substrate is used as the substrate 31. As illustrated in FIG. 30, an impurity is first implanted in the surface of the substrate 31, so as to form a channel cut layer 32 that contains an impurity of the same conductivity type (hereinafter, p-type) as that of the later-formed channel layers 34a and 34b and has an impurity concentration higher than that of the channel layers 34a and 34b.

After that, a silicon germanium epitaxial layer 33a is formed on the channel cut layer 32 by epitaxial growth, and then the non-doped silicon channel layer 34a is formed on the epitaxial layer 33a by further epitaxial growth. Then, a silicon germanium epitaxial layer 33b is formed on the channel layer 34a by the epitaxial growth, and then the non-doped silicon channel layer 34b is formed on the epitaxial layer 33b by the epitaxial growth.

For example, the epitaxial layers 33a and 33b and channel layers 34a and 34b each have a thickness of 4 to 8 nm.

Figure 31:
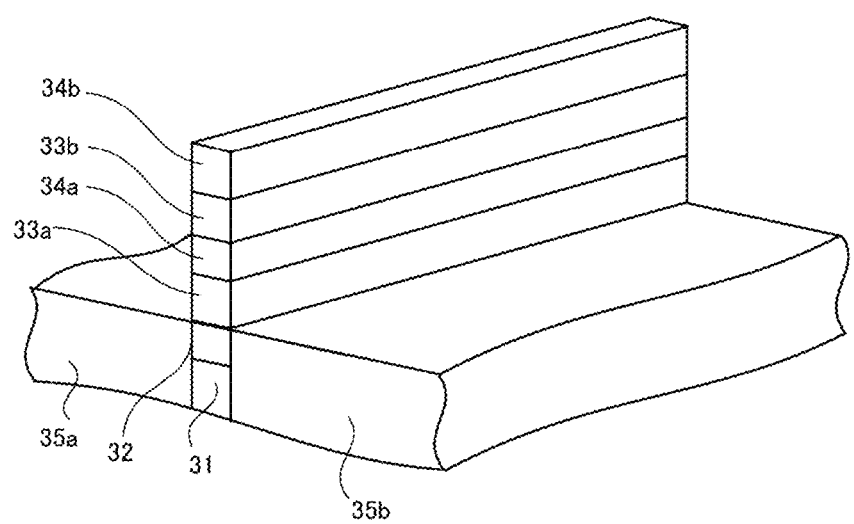
FIG. 31 is a perspective view illustrating one step included in the semiconductor device manufacturing method according to the second embodiment (part 2)

After that, an etching process is performed on the laminated structure illustrated in FIG. 30 so as to form STI formation regions with, for example, a depth of approximately 30 to 50 nm in the substrate 31. Then, for example, the HDP-CVD process is performed on the structure after the etching process, so as to embed a silicon oxide film in the STI formation regions. Further, a flattening process by the CMP and a hydrofluoric acid treatment are performed so as to make the silicon oxide film retreated and to form a fin structure and STIs 35a and 35b as illustrated in FIG. 31. The STIs 35a and 35b are formed such that their top surfaces are flush with the bottom surface of the silicon germanium epitaxial layer 33a.

Then, an impurity is implanted in the channel layers 34a and 34b. Here, a p-type impurity is implanted in the case where the transistor with fin structure is an n-channel MOSFET, and an n-type impurity is implanted in the case where the transistor with fin structure is a p-channel MOSFET. In this connection, the impurity implantation in the channel layers 34a and 34b may be performed when the channel layers 34a and 34b are formed by the epitaxial growth. Furthermore, for example, in the case where the p-type impurity is implanted in advance in the channel layers 34a and 34b for the n-channel MOSFET during the epitaxial growth, an n-type impurity may additionally be implanted at this time point in regions of the channel layers 34a and 34b where p-channel MOSFETs are to be formed. Similarly, for example, in the case where an n-type impurity is implanted in advance in the channel layers 34a and 34b for the p-channel MOSFET during the epitaxial growth, a p-type impurity may additionally be implanted at this time point in regions of the channel layers 34a and 34b where n-channel MOSFETs are to be formed.

In this connection, in the case where the p-type impurity is implanted in the channel layers 34a and 34b, channel regions (inversion layers) that are converted to n-type when the transistor with fin structure is in on state are formed in the channel layers 34a and 34b. In the case where the n-type impurity is implanted in the channel layers 34a and 34b, channel regions that are converted to p-type when the transistor with fin structure is in on state are formed in the channel layers 34a and 34b.

Then, thermal oxidation is performed to form a gate oxide film (not illustrated) with, for example, a thickness of approximately 1 to 3 nm on the side surface and top surface of the laminated structure illustrated in FIG. 31. In addition, the CVD process is performed to deposit a polysilicon film and a hard mask layer in order. The hard mask layer is a silicon nitride film or a silicon oxide film, for example. Then, an etching process is performed on the laminated film formed of the polysilicon film and hard mask layer. In this connection, when the etching reaches the gate oxide film, the etching process is stopped so as not to remove the gate oxide film.

Figure 32:
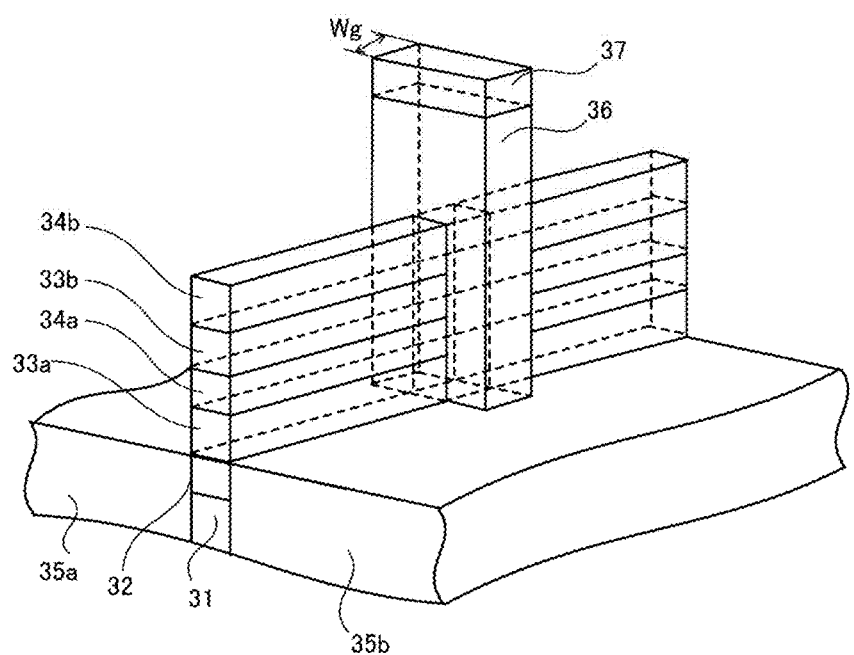
FIG. 32 is a perspective view illustrating one step included in the semiconductor device manufacturing method according to the second embodiment (part 3)

The etching process involves such patterning that the polysilicon film straddles the fin structure, so that a dummy gate 36 and a hard mask 37 disposed on the dummy gate 36 are formed as illustrated in FIG. 32. The dummy gate 36 is formed to have a gate width Wg of approximately 10 to 14 nm, for example.

In this connection, the dummy gate 36 is replaced with the gate electrode 42 (except the portions 42a and 42b of FIG. 23) in a later-described step.

Figure 33:
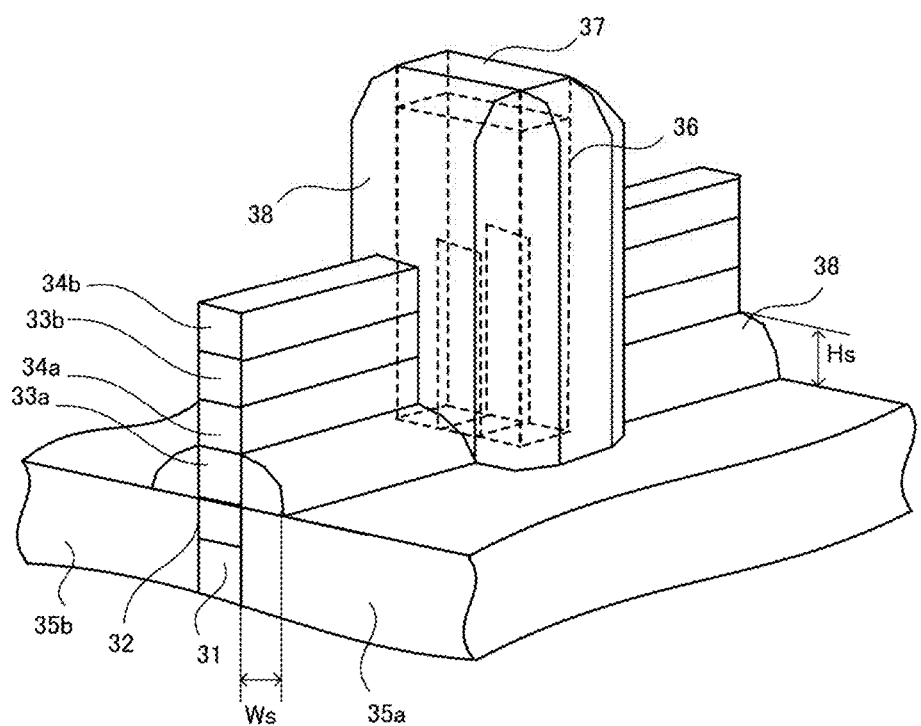
FIG. 33 is a perspective view illustrating one step included in the semiconductor device manufacturing method according to the second embodiment (part 4)

After that, in order to form the sidewall insulating film 38, the CVD process is performed to deposit a silicon nitride film on the structure illustrated in FIG. 32, for example. Then, anisotropic etching is performed to etch back the silicon nitride film such that the silicon nitride film remains on the side walls of the silicon germanium epitaxial layer 33a, dummy gate 36, and hard mask 37, thereby forming the sidewall insulating film 38 as illustrated in FIG. 33.

In this connection, the sidewall insulating film 38 has a width Ws of approximately 8 to 12 nm, for example. In addition, the sidewall insulating film 38 formed on the side walls of the epitaxial layer 33a has a height Hs of 4 to 8 nm, which is approximately the same as the thickness of the epitaxial layer 33a.

In order to form the sidewall insulating film 38 by the above etch-back, the above-described silicon nitride film is deposited to have a thickness greater by approximately 30% than the target thickness Ws in the deposition step.

Figure 34:
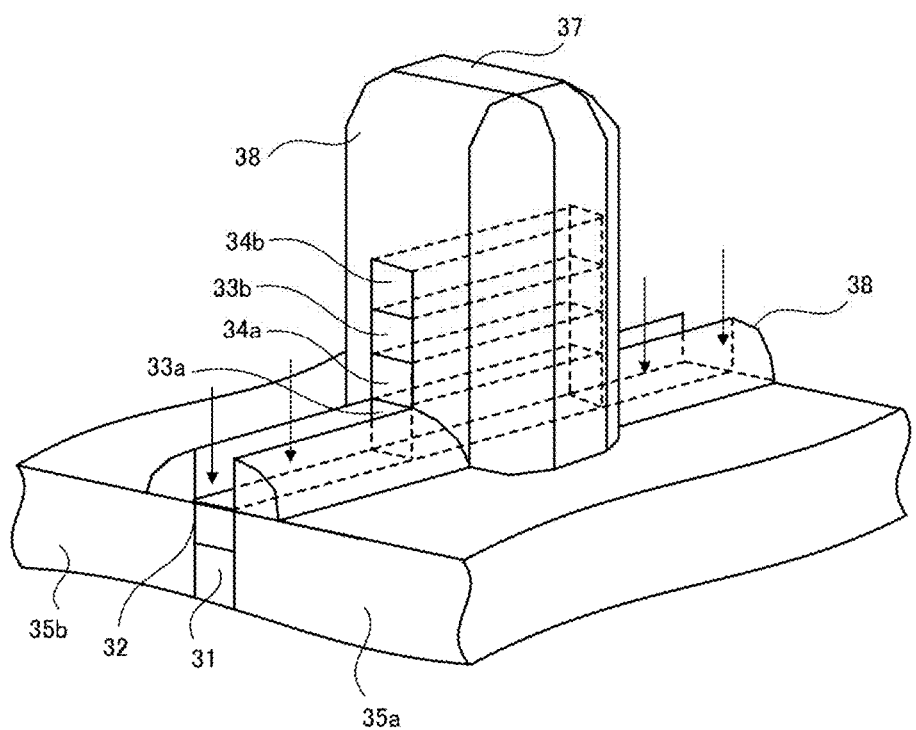
FIG. 34 is a perspective view illustrating one step included in the semiconductor device manufacturing method according to the second embodiment (part 5)

Then, using the hard mask 37 and sidewall insulating film 38 as masks, the anisotropic etching is performed in the arrow direction illustrated in FIG. 34. Thereby, portions of the silicon germanium epitaxial layers 33a and 33b and channel layers 34a and 34b other than those masked by the hard mask 37 and sidewall insulating film 38 are removed. In this connection, the dummy gate 36 is not illustrated in FIG. 34 and subsequent drawings.

Figure 35:
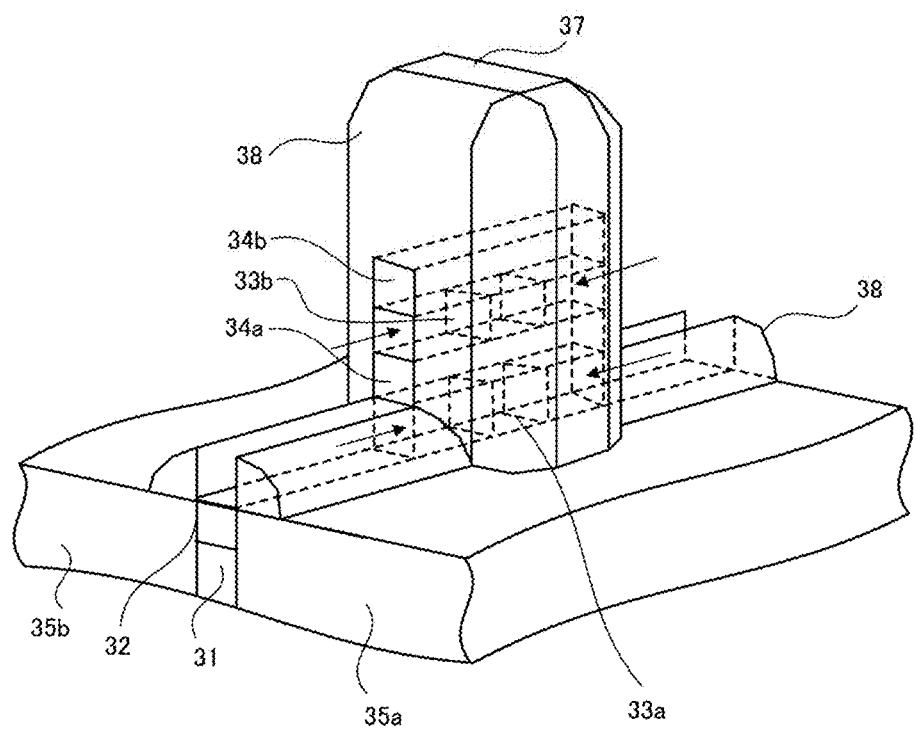
FIG. 35 is a perspective view illustrating one step included in the semiconductor device manufacturing method according to the second embodiment (part 6)

After the anisotropic etching, isotropic etching is performed on the silicon germanium epitaxial layers 33a and 33b such that only the central portions of the silicon germanium epitaxial layers 33a and 33b under the bottom surfaces of the channel layers 34a and 34b (the portions sandwiched by the lower portions of the dummy gate 36) remain, as illustrated in FIG. 35.

At this time, if the widths of the remaining epitaxial layers 33a and 33b are much greater than the gate width Wg, the following problem would occur: in a later-described step of further removing the remaining epitaxial layers 33a and 33b and embedding a metal material for the gate electrode 42 in the removed spaces, the metal material may fail to fill the spaces properly. If this happens, the gate electrode 42 and the semiconductor layer 39 may be separated from each other. With the separation, the gate potential is unable to affect the semiconductor layer 39, which may fail to obtain the functions of the above-described transistors 45a and 45b.

For this reason, the etching time is desirably adjusted so that the widths of the remaining epitaxial layers 33a and 33b are the same as the gate width Wg or less than the gate width Wg considering a process margin. In the following, assume that the widths of the remaining epitaxial layers 33a and 33b are the same as the gate width Wg.

Figure 36:
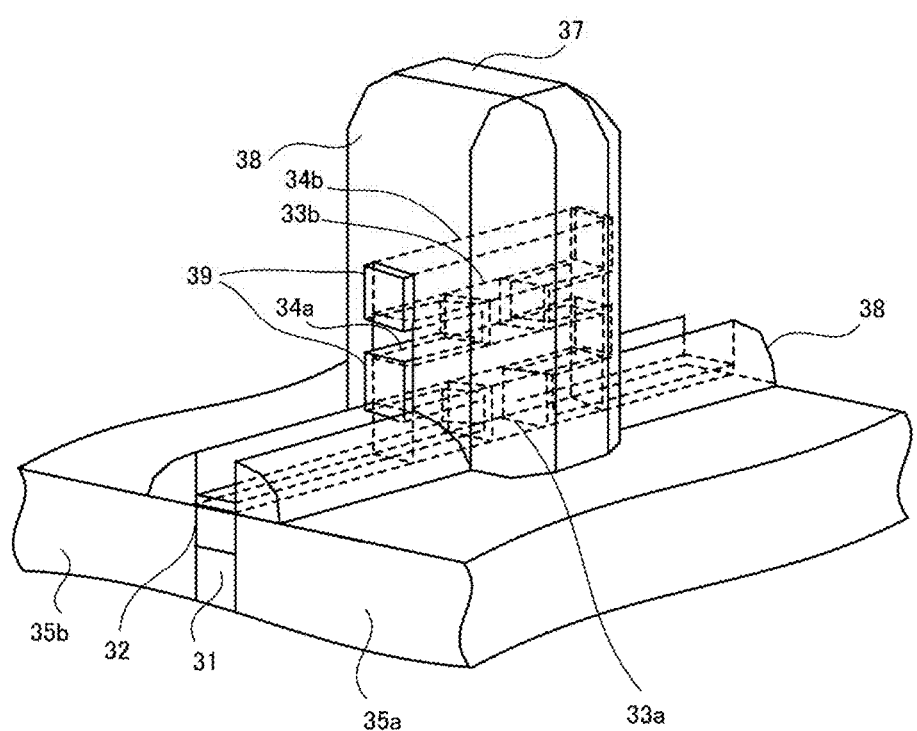
FIG. 36 is a perspective view illustrating one step included in the semiconductor device manufacturing method according to the second embodiment (part 7)

Then, using the above-described technique for the epitaxial growth, a silicon semiconductor layer 39 is formed on the top surface of the channel cut layer 32, the exposed side surfaces of the silicon germanium epitaxial layers 33a and 33b, the exposed side surfaces, top surface, and bottom surface of the channel layer 34a, and the exposed side surfaces and bottom surface of the channel layer 34b, as illustrated in FIG. 36. The semiconductor layer 39 is formed to have a thickness of 1 to 5 nm, for example.

In the semiconductor layer 39, an impurity of an opposite conductivity type to that of the channel layers 34a and 34b may be implanted, or an impurity of the same conductivity type as that of the channel layers 34a and 34b may be implanted with an impurity concentration lower than or the same as that of the channel layers 34a and 34b, as described earlier. In this connection, an n-type or p-type impurity does not need to be implanted in the semiconductor layer 39. For example, in the case where the semiconductor layer 39 contains an n-type or p-type impurity with an impurity concentration of $1.0 \times 10^{15}$ cm$^{-3}$ or less, the semiconductor layer 39 may be treated as a non-doped layer in which no impurity is substantially implanted.

Figure 37:
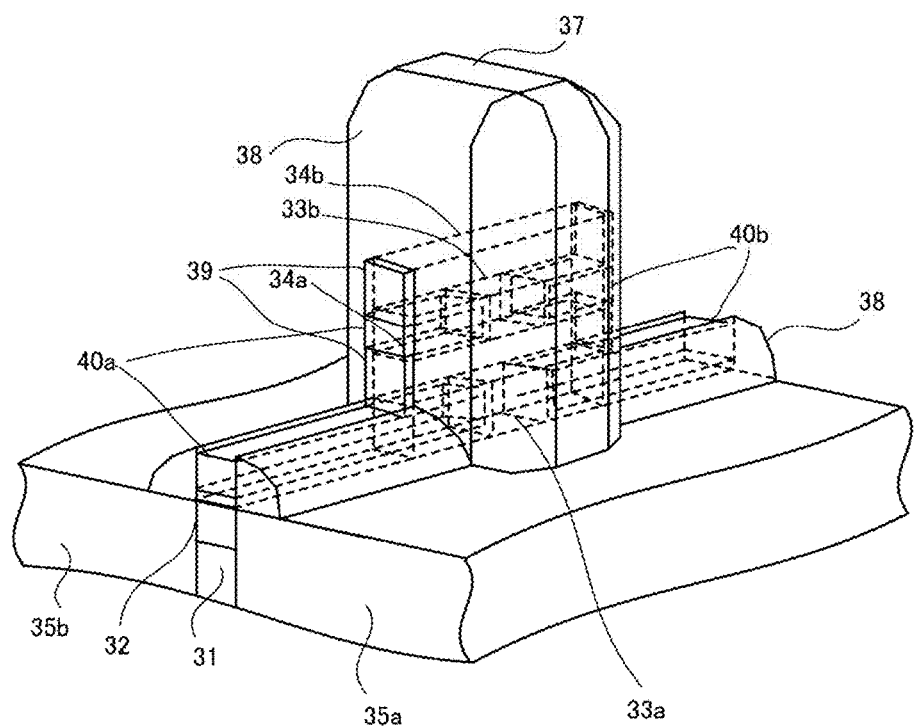
FIG. 37 is a perspective view illustrating one step included in the semiconductor device manufacturing method according to the second embodiment (part 8)

Then, as illustrated in FIG. 37, insulating layers 40a and 40b that are silicon oxide films are embedded in regions sandwiched by the sidewall insulating film 38 and regions under the channel layers 34a and 34b (where the silicon germanium epitaxial layers 33a and 33b have been removed). To achieve proper embedding here, deposition of a silicon oxide film and etching may be combined as appropriate. For example, the deposition of a silicon oxide film by the CVD process, the anisotropic etching, and the HDP-CVD process may be performed in this order. The anisotropic etching may be performed at the end.

In the case where the silicon oxide film remains on the side walls of the semiconductor layer 39 formed on the side surfaces of the channel layers 34a and 34b, the silicon oxide film may be removed using hydrofluoric acid or the like, for example.

Figure 38:
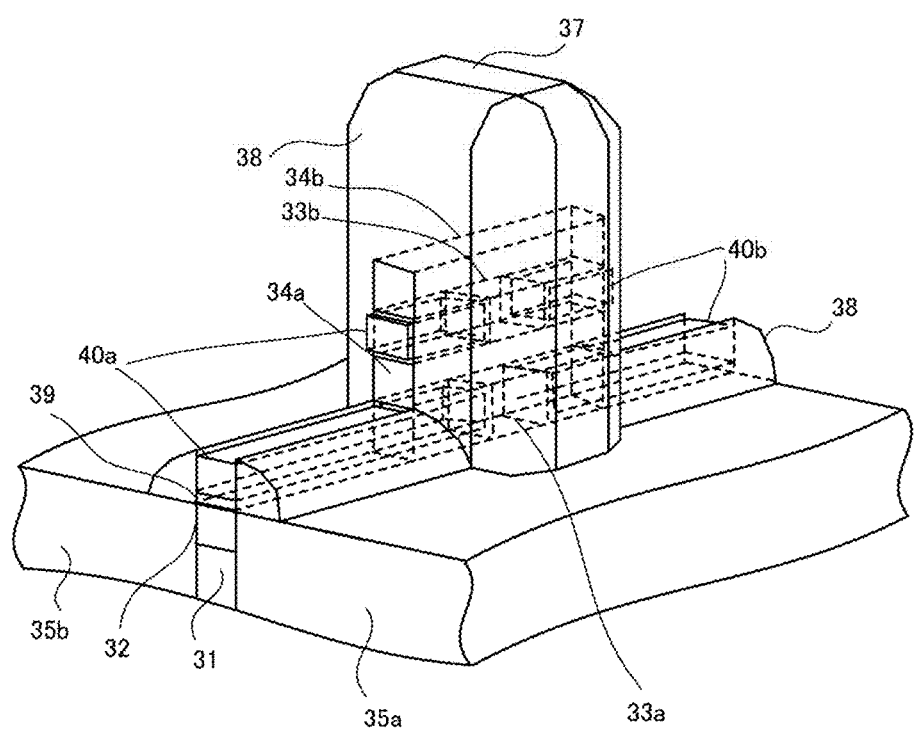
FIG. 38 is a perspective view illustrating one step included in the semiconductor device manufacturing method according to the second embodiment (part 9)

Then, the semiconductor layer 39 formed on the side surfaces of the channel layers 34a and 34b may be removed (see FIG. 38). To remove the semiconductor layer 39, the isotropic etching may be performed or the anisotropic etching may be performed using the hard mask 37 and sidewall insulating film 38 as masks. The reason why the semiconductor layer 39 formed on the side surfaces of the channel layers 34a and 34b is removed will be described later (with reference to FIG. 41).

Figure 39:
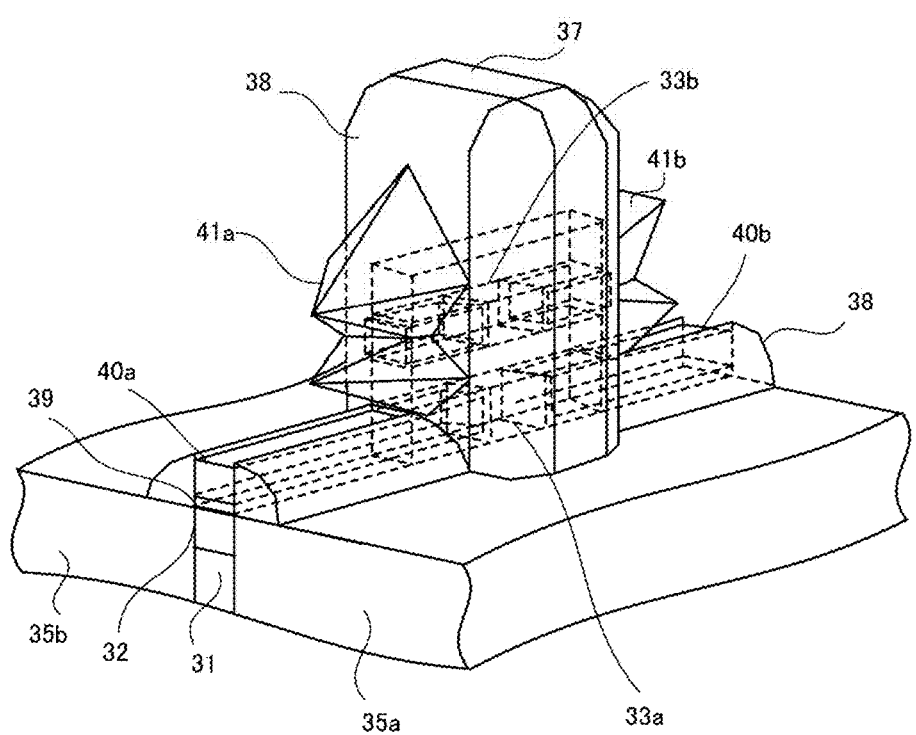
FIG. 39 is a perspective view illustrating one step included in the semiconductor device manufacturing method according to the second embodiment (part 10)

Then, as illustrated in FIG. 39, a source layer 41a and a drain layer 41b are formed. The source layer 41a and drain layer 41b are formed on two opposite side surfaces of the channel layers 34a and 34b by the epitaxial growth. The shapes of the formed source layer 41a and drain layer 41b depend on the crystal faces and others of these two side surfaces of the channel layers 34a and 34b on which the epitaxial growth is performed for the source layer 41a and drain layer 41b. In addition, an impurity of an opposite conductivity type to that of the channel layers 34a and 34b is implanted in the source layer 41a and drain layer 41b.

Then, although not illustrated, for example, the CVD process is performed to deposit a silicon oxide film, as an inter-layer insulating film, which covers the structure illustrated in FIG. 39. Then, the CMP is performed to flatten the silicon oxide film.

In the case where the hard mask 37 is a silicon oxide film, the hard mask 37 is removed by the CMP as well, so that the top surface of the polysilicon dummy gate 36 is exposed.

In the case where the hard mask 37 is a silicon nitride film, the top surface of the hard mask 37 is exposed by the CMP. After that, the hard mask 37, which is a silicon nitride film, is etched using the silicon oxide film that is an inter-layer insulating film as a mask so as to remove the hard mask 37 and thereby expose the top surface of the polysilicon dummy gate 36.

Figure 40:
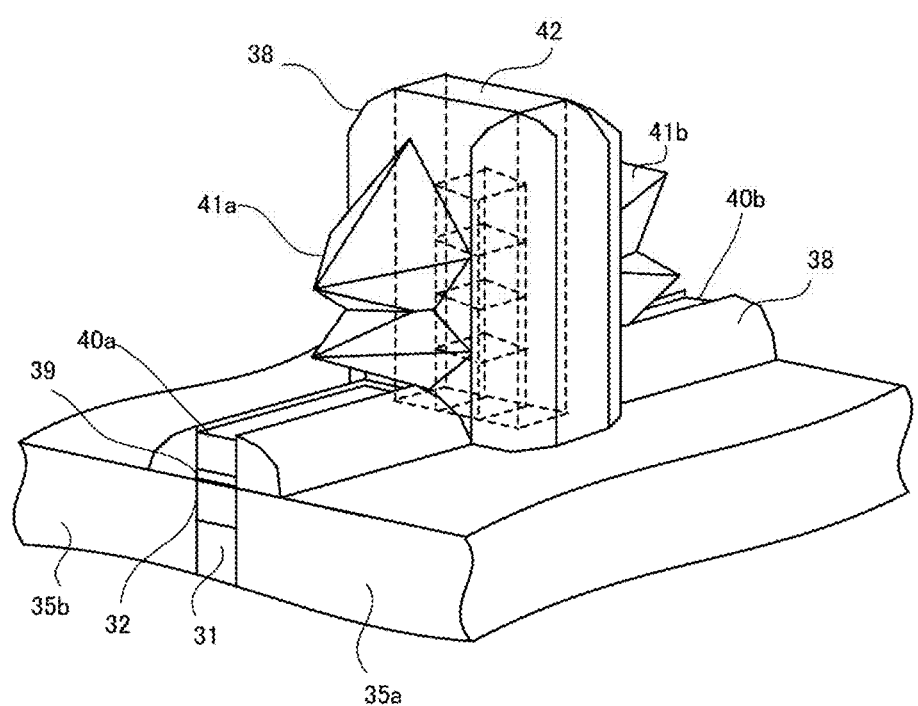
FIG. 40 is a perspective view illustrating one step included in the semiconductor device manufacturing method according to the second embodiment (part 11)

After that, the RMG step is executed to replace the dummy gate 36 and the silicon germanium epitaxial layers 33a and 33b remaining under the channel layers 34a and 34b with a gate electrode 42 (see FIG. 40). In this connection, the channel layers 34a and 34b are not illustrated in FIG. 40.

In the RMG step, the dummy gate 36 is removed by gas-phase etching, wet etching, or another. The gate oxide film, not illustrated, protects the channel layers 34a and 34b and others during the removal of the dummy gate 36. Then, after the gate oxide film is removed by a hydrofluoric acid treatment or another, the epitaxial layers 33a and 33b remaining under the channel layers 34a and 34b are removed by the isotropic etching. After that, a gate insulating film, not illustrated, is formed on the surfaces of the channel layers 34a and 34b and substrate 31 exposed in the spaces where the dummy gate 36 and epitaxial layers 33a and 33b have been removed. In addition, a metal material fills the area where the dummy gate 36 and hard mask 37 have been removed and the areas where the epitaxial layers 33a and 33b remaining under the channel layers 34a and 34b have been removed, on the gate insulating film. Thereby, the gate electrode 42 illustrated in FIG. 40 is formed.

For the gate insulating film and gate electrode 42, the same materials as used for the gate insulating film and gate electrode provided in the semiconductor device 10 of the first embodiment may be used, for example.

With the above-described manufacturing method, the semiconductor device 30 as illustrated in FIGS. 22 to 26 is manufactured.

The following describes why the semiconductor layer 39 formed on the side surfaces of the channel layers 34a and 34b is removed.

Figure 41:
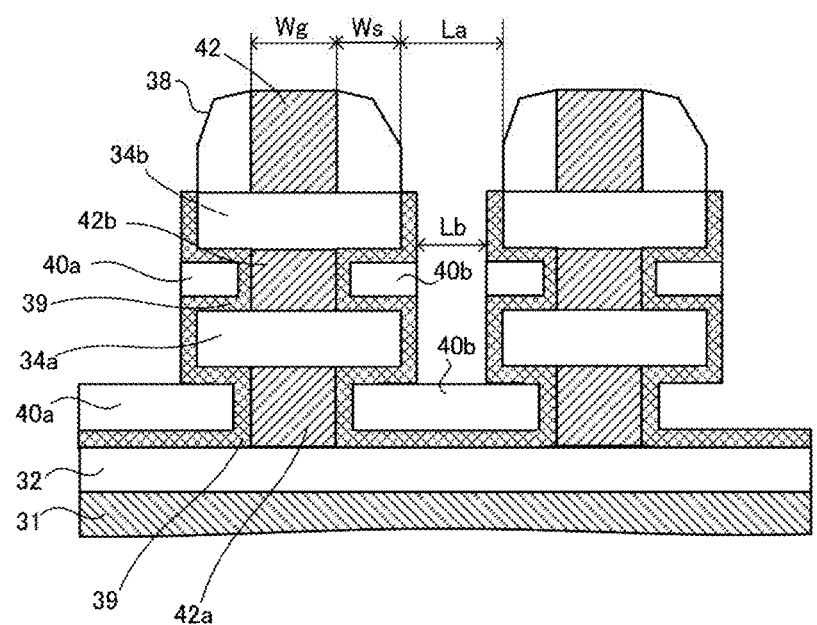
FIG. 41 illustrates an example of two adjacent transistors with fin structures.

FIG. 41 illustrates an example of two adjacent transistors with fin structures. In this connection, their source layers 41a and drain layers 41b are not illustrated in FIG. 41.

In the case where the semiconductor layer 39 is not removed from the side surfaces of the channel layers 34a and 34b, a space for forming a source layer 41a and a drain layer 41b between the two transistors with fin structures may be too narrow.

For example, in the example of FIG. 41, the gate electrodes 42 each have a gate width Wg of approximately 10 to 14 nm, and the sidewall insulating films 38 each have a width Ws of approximately 8 to 12 nm. For example, in the case where the inter-gate distance La between the two transistors with fin structures (the distance between the adjacent sidewall insulating films) is approximately 12 nm and the semiconductor layers 39 with a thickness of 1 to 2 nm are formed on the side surfaces of the channel layers 34a and 34b, the distance Lb between the semiconductor layers on which the source layer 41a and drain layer 41b are formed is 8 to 10 nm, which is shorter by 20 to 30% than La.

For this reason, the semiconductor layer 39 on the side surfaces of the channel layers 34a and 34b is desirably removed before the source layer 41a and drain layer 41b are formed.

However, in the case where the distance La is long enough to form the source layer 41a and drain layer 41b, the semiconductor layer 39 does not need to be removed.

Fourth Comparative Example

Figure 42:
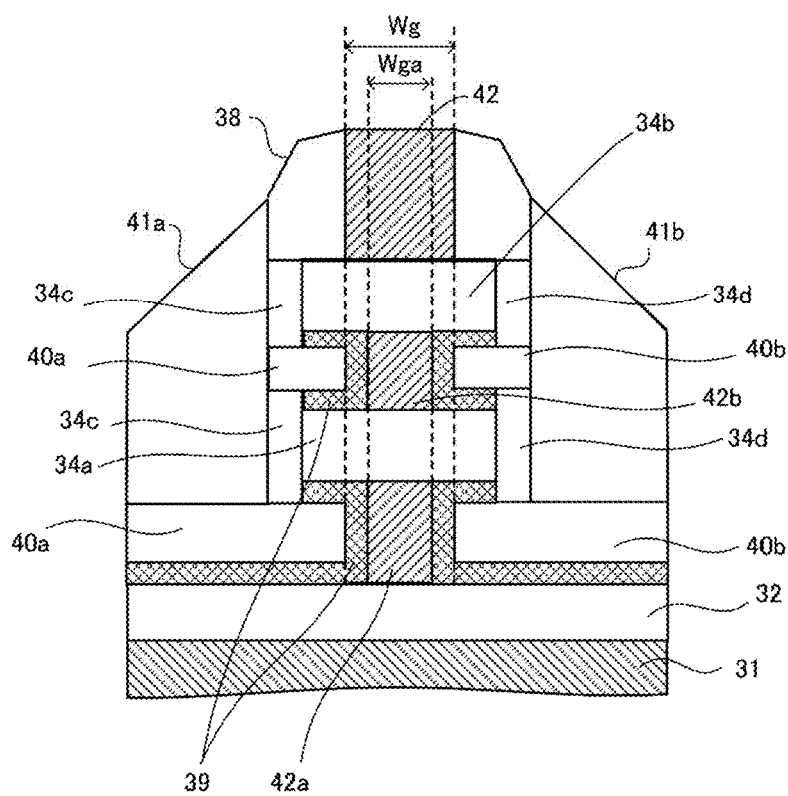
FIG. 42 is a sectional view illustrating an example of a semiconductor device in which the gate width under a channel layer is less than that over the channel layer.

FIG. 42 is a sectional view illustrating an example of a semiconductor device in which the gate width under a channel layer is less than that over the channel layer.

In the case where the etching time for the isotropic etching illustrated in FIG. 35 to remove the silicon germanium epitaxial layers 33a and 33b is adjusted so that the widths of the remaining epitaxial layers 33a and 33b are less than the gate width Wg, the structure as illustrated in FIG. 42 is obtained. That is, the widths Wga of the portions 42a and 42b of the gate electrode 42 under the channel layers 34a and 34b are less than the gate width Wg of the portion of the gate electrode 42 over the channel layer 34b.

Fifth Comparative Example

Figure 43:
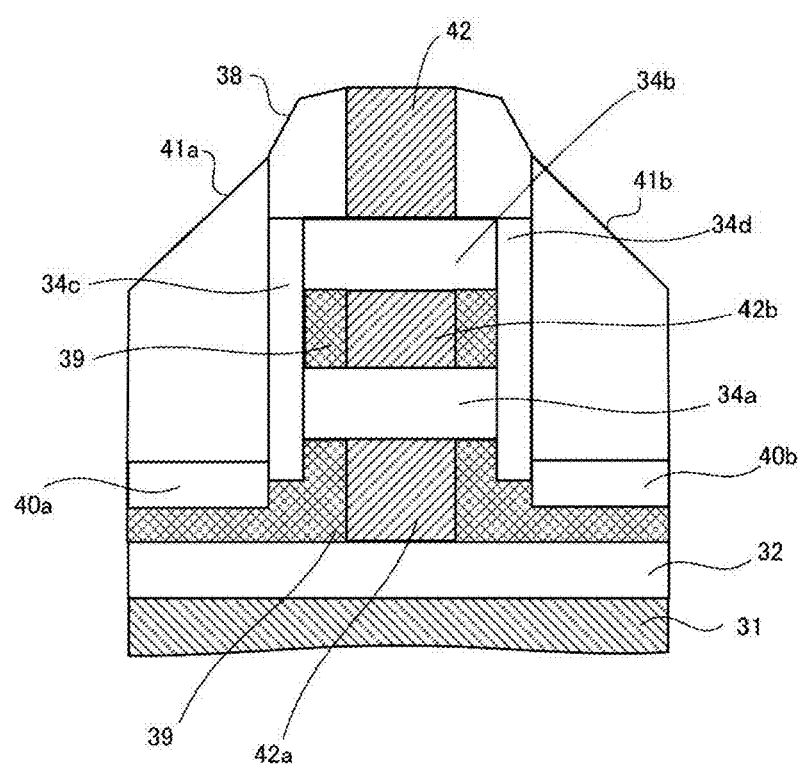
FIG. 43 is a sectional view illustrating an example of a semiconductor device in which a semiconductor layer is thick and fills in between two channel layers and between the lower channel layer and a substrate.

FIG. 43 is a sectional view illustrating an example of a semiconductor device in which a semiconductor layer is thick and fills in between two channel layers and between the lower channel layer and a substrate.

Referring to the example of FIG. 43, the semiconductor layer 39 is thick and fills in between the channel layer 34a and the channel layer 34b and between the channel layer 34a and substrate 31. In this case, the insulating layers 40a and 40b are not formed between the channel layer 34a and channel layer 34b or between the channel layer 34a and the substrate 31 under the sidewall insulating film 38 as illustrated in FIG. 43. However, this structure provides the same effects as the above-described semiconductor device 30 of the second embodiment.

The above-described embodiments have described one aspect of a semiconductor device and a method of manufacturing the semiconductor device. However, these are merely one example and are not limited to the above description.

For example, FIGS. 2 and 22 illustrate the cases where the transistors with fin structures in the semiconductor devices 10 and 30 are n-channel MOSFETs. These transistors, however, may be p-channel MOSFETs. In this case, the conductivity type of each element is changed to an opposite conductivity type.

In addition, the above-described examples use silicon substrates as the substrates 11 and 31. The structure is not limited thereto. Silicon germanium or another material may be used for the substrates 11 and 31. A different material may be used for each element in the semiconductor devices 10 and 30. For example, in the case where the substrates 11 and 31 are silicon germanium substrates, silicon may be used for the epitaxial layers 13, 33a, and 33b, and silicon germanium may be used for the channel layers 14, 34a, and 34b.

According to one aspect, the disclosed embodiments make it possible to suppress the floating body effect without losing the advantage of the SOI structure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device including a transistor with fin structure, the semiconductor device comprising:
   a channel layer disposed over a substrate, the channel layer being connected to the substrate via a semiconductor layer;
   a source layer disposed on a first side surface of the channel layer over the substrate, the source layer being separated from the substrate via a first insulating layer, the source layer serving as a source of the transistor;
   a drain layer disposed on a second side surface of the channel layer opposite to the first side surface over the substrate, the drain layer being separated from the substrate via a second insulating layer, the drain layer serving as a drain of the transistor; and
   a gate electrode including a first portion disposed over the channel layer and a second portion disposed between the substrate and the channel layer, the gate electrode serving as a gate of the transistor, wherein the second portion has a third side surface and a fourth side surface opposite to the third side surface, and the third side surface or the fourth side surface faces the semiconductor layer.

2. The semiconductor device according to claim 1, wherein the channel layer is connected to the substrate via the semiconductor layer disposed between the first insulating layer and the third side surface of the second portion or between the second insulating layer and the fourth side surface of the second portion.

3. The semiconductor device according to claim 1, wherein a first transistor of an opposite conductivity type to the transistor is formed by the substrate, the channel layer, the semiconductor layer, and the second portion of the gate electrode.

4. The semiconductor device according to claim 1, wherein the channel layer contains a first impurity, and the semiconductor layer contains a second impurity of an opposite conductivity type to the first impurity.

5. The semiconductor device according to claim 1, wherein the channel layer contains a first impurity, and the semiconductor layer contains a second impurity of a same conductivity type as the first impurity with an impurity concentration lower than an impurity concentration of the channel layer.

6. The semiconductor device according to claim 1, wherein the semiconductor layer is a non-doped layer.

7. The semiconductor device according to claim 1, wherein the channel layer contains a first impurity, and
   an impurity layer is formed at a surface of the substrate, the impurity layer containing a second impurity of a same conductivity type as the first impurity with an impurity concentration higher than an impurity concentration of the channel layer.

8. The semiconductor device according to claim 1, further comprising
   a sidewall insulating film disposed on a side wall of the first portion, wherein
   parts of top surfaces of the first insulating layer and the second insulating layer under the sidewall insulating film contact a bottom surface of the semiconductor layer disposed on a bottom surface of the channel layer.

9. The semiconductor device according to claim 1, wherein a width of the second portion of the gate electrode is less than a width of the first portion of the gate electrode.

10. The semiconductor device according to claim 1, wherein
the channel layer includes a first channel layer and a second channel layer disposed over the first channel layer, and
the gate electrode further includes a third portion between the first channel layer and the second channel layer.

11. The semiconductor device according to claim 10, wherein a second transistor of an opposite conductivity type to the transistor is formed by the first channel layer, the second channel layer, the semiconductor layer, and the third portion of the gate electrode.

12. The semiconductor device according to claim 1, wherein the semiconductor layer is further disposed between the substrate and the first insulating layer and between the substrate and the second insulating layer.

13. The semiconductor device according claim 1, further comprising
a sidewall insulating film on a side surface of the gate electrode, wherein
a material of the sidewall insulating film is a silicon nitride film.

14. A method of manufacturing a semiconductor device including a transistor with fin structure, the method comprising:
forming a channel layer over a substrate, the channel layer being connected to the substrate via a semiconductor layer;
forming a source layer on a first side surface of the channel layer over the substrate, the source layer being separated from the substrate via a first insulating layer, the source layer serving as a source of the transistor;
forming a drain layer on a second side surface of the channel layer opposite to the first side surface over the substrate, the drain layer being separated from the substrate via a second insulating layer, the drain layer serving as a drain of the transistor; and
forming a gate electrode including a first portion disposed over the channel layer and a second portion disposed between the substrate and the channel layer, the gate electrode serving as a gate of the transistor, wherein the second portion has a third side surface and a fourth side surface opposite to the third side surface, and the third side surface or the fourth side surface faces the semiconductor layer.

15. The method of manufacturing the semiconductor device according to claim 14, further comprising forming the semiconductor layer on the first side surface or the second side surface of the channel layer and on a part of a bottom surface of the channel layer by epitaxial growth.

16. The method of manufacturing the semiconductor device according to claim 15, further comprising removing the semiconductor layer formed on the first side surface and the second side surface of the channel layer.

17. The method of manufacturing the semiconductor device according to claim 14, wherein
the forming of the channel layer includes forming the channel layer including a first channel layer and a second channel layer disposed over the first channel layer, and
the forming of the gate electrode includes forming the gate electrode including the first portion disposed over the second channel layer, the second portion disposed between the substrate and the first channel layer, and a third portion disposed between the first channel layer and the second channel layer.

18. The method of manufacturing the semiconductor device according to claim 14, wherein a first transistor of an opposite conductivity type to the transistor is formed by the substrate, the channel layer, the semiconductor layer, and the second portion of the gate electrode.

19. The method of manufacturing the semiconductor device according to claim 14, further comprising forming a sidewall insulating film on a side surface of the gate electrode, wherein
a material of the sidewall insulating film is a silicon nitride film.

20. The method of manufacturing the semiconductor device according to claim 14, further comprising forming a dummy electrode before forming the gate electrode, and then replacing the dummy electrode with the gate electrode.

* * * * *